(12) United States Patent
Kamijima et al.

(10) Patent No.: US 6,465,149 B2
(45) Date of Patent: Oct. 15, 2002

(54) SOLUTION TO BE OPTICALLY TREATED, A METHOD FOR FORMING AN ANTIREFLECTION FILM, A METHOD FOR PATTERN-PLATING AND A METHOD FOR MANUFACTURING A THIN FILM MAGNETIC HEAD

(75) Inventors: Akifumi Kamijima; Junichi Hokushin, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/536,390

(22) Filed: Mar. 28, 2000

(65) Prior Publication Data

US 2002/0106578 A1 Aug. 8, 2002

(30) Foreign Application Priority Data

Apr. 28, 1999 (JP) ............................... 11-123124

(51) Int. Cl.⁷ .................................. G03F 7/004
(52) U.S. Cl. ................. 430/270.1; 430/271.1; 430/311; 430/313; 430/324
(58) Field of Search ............................ 430/270.1, 311, 430/313, 324

(56) References Cited

U.S. PATENT DOCUMENTS

| | | | | |
|---|---|---|---|---|
| 4,524,121 A | * | 6/1985 | Gleim et al. ................. | 430/176 |
| 4,745,042 A | | 5/1988 | Sasago et al. ............... | 430/156 |
| 5,252,831 A | * | 10/1993 | Weiss ..................... | 250/370.11 |
| 5,604,073 A | * | 2/1997 | Kronubi et al. ................ | 430/14 |
| 5,800,963 A | * | 9/1998 | Knors et al. ............. | 430/270.1 |

FOREIGN PATENT DOCUMENTS

| | | |
|---|---|---|
| JP | A-52-123824 | 10/1977 |
| JP | A-57-210893 | 12/1982 |
| JP | A-59-93448 | 5/1984 |
| JP | A-62-136027 | 6/1987 |
| JP | A-9-180127 | 7/1997 |

OTHER PUBLICATIONS

Polymer Science Dictionary, 2nd Ed., M. Alger, Chapman & Hall, NY, 1997, pp. 404, 430.*

* cited by examiner

Primary Examiner—Rosemary Ashton
(74) Attorney, Agent, or Firm—Oliff & Berridge, PLC

(57) ABSTRACT

A solution to be optically treated including a cyclopentanone solvent, polymethylglutarimide and a light absorption dye is applied onto a body to be plated 100 including an inclined portion 200, and thereafter, is thermally treated to form an antireflection film 300. Then, a photoresist 400 is applied so as to cover the antireflection film. Subsequently, a photolithography process to form a plate-pattern on the body to be plated is carried out for the photoresist 400 and the antireflection film 300.

28 Claims, 19 Drawing Sheets

SOLUTION TO BE OPTICALLY TREATED, A METHOD FOR FORMING AN ANTIREFLECTION FILM, A METHOD FOR PATTERN-PLATING AND A METHOD FOR MANUFACTURING A THIN FILM MAGNETIC HEAD

BACKGROUND OF THE INVENTION

1. Field of the Invention

This invention relates to a solution to be optically treated, a method for forming an antireflection film, a method for pattern-plating and a method for manufacturing a thin film magnetic head using the pattern-plating method.

2. Related Art Statement

In a manufacturing method of a thin film magnetic head, normally, a second magnetic film serving as a top magnetic film is formed after a first magnetic film (bottom magnetic film), a gap film, an insulating film to support a coil film are formed on a wafer. Moreover, in the case of forming the second magnetic film, a plate-underfilm is formed on the whole surface of the wafer including the insulating film by a sputtering method, etc. Subsequently, a photoresist is applied on the surface of the plate-underfilm and is processed by a photolithography method to form a resist frame for forming the second magnetic film. Then, the second magnetic film is formed in the area surrounding the resist frame by an electroplating, etc. A film composed of the material constituting the second magnetic film is plated in an area beyond the resist frame, but it is removed.

In the second magnetic film-forming process, however, an exposing light in the photolithography process to form the resist frame is reflected at the surface of the insulating film and then, the reflected exposing light reaches an area beyond a photomask-defining area and exposes the photoresist around the area, resulting in the degradations of the pattern precision of the resist frame and the second magnetic precision.

The degradation of the pattern precision is conspicuous at the pole portion of the second magnetic film. The pole portion of the second magnetic film is opposed to the first magnetic film via the gap film. On the backward area from the pole portion is positioned the insulating film rising up with an inclination of a given angle from the surface of the gap film. The starting point of the rising up corresponds to a Throat Height zero point and the rising up angle corresponds to an Apex Angle.

The second magnetic film constitutes the pole portion parallel to the gap film and the first magnetic film up to the Throat Height zero point and then, rises up with an inclination of the Apex Angle toward the top surface of the insulating film from the Throat Height zero point.

Thus, in the case of fabricating the resist frame for forming the second magnetic film by the photolithography process, the photoresist stuck on the inclined portion at the Apex Angle of the insulating film toward the top surface must be exposed.

The plate-underfilm already stuck on the inclined portion reflects the exposing light. The part of the reflected exposing light reaches the pole portion. Thus, the exposing pattern of the pole portion is different from that of the photomask, resulting in the pattern destruction in a part of the resist frame corresponding to the pole portion.

The pattern destruction of the resist frame has difficulty in developing a recording density by narrowing a recording track width up to not more than 1.0 $\mu$m.

Japanese Patent Application Kokai Hei 9-180127 (JP A 9-180127) discloses that before applying the photoresist as a mask for a top magnetic film, is formed the antireflection film, on which the photoresist frame is applied and the photoresist is exposed and developed to form the resist-frame.

However, the conventional antireflection film is not dissolved in an alkaline developer to remove the resist frame. Accordingly, the antireflection is removed by an ashing method, etc. after the resist frame is removed by the alkaline developer, and then, the second magnetic film is formed, which results in the increase of the process number.

The antireflection film exists over the interior pattern surrounded by the resist frame. Then, the interior pattern has a pole portion area corresponding to the pole portion of the top magnetic film and a second yoke portion area corresponding to a yoke portion. Thus, the antireflection film has to be removed in both the pole portion area and the yoke portion area.

In the resist frame, however, the pole portion area has an extremely different opening area from that of the second yoke portion. Moreover, the pole portion tends to have the narrowed opening area of not more than 1 $\mu$m for a high density recording. Accordingly, in the case of removing the antireflection film stuck on the interior pattern surrounded by the resist frame, the pole portion area has an extremely different etching rate from that of the second yoke portion, so that the pole portion area requires a longer etching time than the yoke portion area. As a result, the resist frame in the pole portion area is etched largely during the removing the antireflection film, resulting in the large distance of the resist frame. In other words, the antireflection film to narrow the width of the pole portion enlarges the distance of the resist frame because of the removing process of the film, resulting in having difficulty in narrowing the pole portion.

For explaining the conventional problems concretely, the method for the thin film magnetic head was described as above-mentioned, but the above problem is generally brought about in a pattern-plating method to plate a pattern on a surface of a body to be plated including an inclined portion.

SUMMARY OF THE INVENTION

It is an object of the present invention to provide a solution to be optically treated to form an antireflection film which resolves a photoresist developer without the intermixing with the photoresist and a method for producing the antireflection film using the solution.

It is another object of the present invention to provide a method for pattern-plating using the solution to be optically treated and a method for manufacturing a thin film magnetic head using the pattern-plating method.

It is still another object of the present invention to provide a method for manufacturing a thin film magnetic head in which a magnetic film is formed in a high precise pattern on an insulating film.

It is further object of the present invention to provide a method suitable for manufacturing a thin film magnetic head having a narrowed recording track width.

This invention relates to a solution to be optically treated comprising a cyclopentanone solvent, polymethylglutarimide and a light absorption dye.

In forming the antireflection film using the solution to be optically treated, the solution is applied onto an object body and thermally treated. Thereby, the antireflection film capable of dissolving in the alkaline developer which is used in the photoresist developing can be obtained without the intermixing with the photoresist. The thermal treatment is preferably carried out at a temperature of 100–200° C.

In the case of pattern-plating using the solution to be optically treated, the antireflection film is formed on a surface of a body to be plated including an inclined portion. Next, the photoresist is formed so as to cover the antireflection film.

Subsequently, a photolithography process to form a plated pattern on the body is carried out for the photoresist and the antireflection film to form a resist frame composed of the photoresist and the antireflection film.

Since the antireflection film capable of dissolving into the alkaline developer which is used on the photoresist developing is formed without the intermixing with the photoresist, in the case of forming the resist frame through the photolithography process, the photoresist and the antireflection film can be patterned at the same time so as to have their same pattern. Moreover, since in the photolithography process, another process to remove the antireflection film is not required, the photolithography process can be simplified.

The solution to be optically treated and the pattern-plating method exhibit conspicuous operation/working effects. As is well known, the thin film magnetic head has a slider and a thin film magnetic head element. The slider has an air bearing surface in the opposing side to a recording medium. The thin film magnetic head element has a first magnetic film, a coil film, an insulating film, a gap film and a second magnetic film, which are supported by the slider.

The first magnetic film has a first pole portion and a first yoke portion. The first pole portion is composed of the end portion of the first magnetic film in the side of the air bearing surface. The first yoke portion is connected to the first pole portion continuously and be extended backward from the air bearing surface.

The gap film is formed at least on a surface of the first pole portion. The insulating film supports the coil film, being positioned on the first yoke portion and has a rising inclined portion in the side of the air bearing surface.

The second magnetic film has a second pole portion and a second yoke portion. The second pole portion is opposite to the first pole portion via the gap film. The second yoke portion is provided on the insulating film, being connected to the second pole portion continuously and is coupled to the first yoke portion backward.

In manufacturing the thin film magnetic head, after forming the first magnetic film, the gap film, the coil film and the insulating film and before forming the second magnetic film, a plate-underfilm for the second magnetic film is formed on the surface of the insulating film including the inclined portion and then, an antireflection film is formed on the plate-underfilm formed on the surface of the insulating film including the inclined portion. The antireflection film is formed by applying the solution to be optically treated in which the PMGI and the light absorption dye are dissolved in the cyclopentanone solvent.

Subsequently, a photoresist is formed so as to cover the antireflection film. A photolithography process for the second magnetic film is carried out for the photoresist and the antireflection film to form a resist frame composed of the photoresist and the antireflection film. Then, the second magnetic film is formed in the pattern area surrounded by the resist frame.

Since the rising inclined portion of the insulating film has the antireflection film, in forming the resist frame by the photolithography process for the second magnetic film, the exposing light is almost never reflected at the inclined portion of the insulating film. Thus, particularly, the exposed pattern of the photoresist to define the second pole portion in the second magnetic film is almost determined by the exposing pattern of a photomask and thereby, the resist frame pattern corresponding to the second pole portion can be formed precisely. Consequently, according to the present invention, the second pole portion can be formed in a precise pattern. Moreover, since the resist frame pattern corresponding to the second pole portion can be formed precisely, the thin film magnetic head having a narrowed recording track width can be manufactured.

Moreover, since the solution to be optically treated can form the antireflection film which dissolves in the alkaline developer which is used in the photoresist developing without the intermixing with the photoresist, in the forming the resist frame by the photolithography process, the photoresist and the antireflection film can be patterned at the same time so as to have their same pattern. Another process to remove the antireflection film is not required. Consequently, the photolithography can be simplified.

Furthermore, the antireflection film can be removed with the photoresist in the developing process, the process to remove only the antireflection film is not required. Thus, the degradation of the pattern precision of the resist frame and the decrease of the height of the resist frame, due to the difference in the etching rates between the second yoke portion and the second pole portion, does not occur. Consequently, the second pole portion and the second yoke portion can be formed in their precise patterns.

This invention may be applied for a self-alignment type (herein-after, called as a "SA type") thin film magnetic head. In the SA type thin film magnetic head, the insulating film includes a first insulating film and a second insulating film. The first insulating film supports the coil film. The second insulating film is formed on the base portion of the first insulating film in the side of the air bearing surface and define the Throat Height zero point.

Moreover, in the second magnetic film, the second yoke portion is positioned on the first insulating film, its one end portion being connected to the second pole portion continuously, its other one end being coupled to the first yoke portion.

In manufacturing the SA type thin film magnetic head, after forming the first magnetic head, the gap film and before forming the coil film, the first insulating film, the second magnetic film, the second insulating film is formed on the gap film.

Next, a plate-underfilm is formed on the gap film and the second insulating film. Then, an antireflection is formed on the plate-underfilm on the second insulating film. The antireflection film is formed by applying the solution to be optically treated in which the PMGI and the light absorption dye are dissolved in the cyclopentanone solvent.

Subsequently, a photoresist is formed so as to cover the antireflection film. Then, a photolithography process for the second magnetic film is carried out for the photoresist and the antireflection film to form a resist frame composed of the photoresist and the antireflection film.

Next, the second pole portion is formed in the pattern surrounded by the resistframe. Thereafter, the first insulating film and the coil film and the second yoke portion are formed.

Since the antireflection film is positioned on the second insulating film in the side of the air bearing surface, in forming the resist frame by the photolithography process for forming the second pole portion in the second magnetic film, an exposing light is almost never reflected at the inclined portion of the second insulating film. Accordingly, the exposed pattern of the photoresist covering the second pole portion is almost defined by the exposing pattern of a photomask and thereby, the photoresist pattern corresponding to the second pole portion can be formed high precisely. As a result, the second pole portion can be formed in a high precise pattern. Moreover, since the resist frame pattern corresponding to the second pole portion can be formed high precisely, the thin film magnetic head having a narrowed recording width can be provided.

Furthermore, since the solution to be optically treated can form the antireflection film which dissolves in an alkaline developer which is used in the photoresist developing, in forming the resist frame by the photolithography process, the photoresist and the antireflection film can be patterned at the same time so as to have their same pattern. Another process to remove the antireflection film is not required. Thus, the photolithography process can be simplified.

Moreover, since the antireflection film is removed with the photoresist, the process to remove only the antireflection film is not required. Accordingly, the degradation of the pattern precision of the resist frame and the decrease of the height of the resist frame, due to the difference in the etching rate between the second yoke portion and the second pole portion, are prevented. Consequently, the second pole portion and the second yoke portion can be formed in their precise patterns.

The other objects, configurations and advantages will be explained in detail, with reference to the attaching drawings in embodiments.

BRIEF DESCRIPTION OF THE DRAWINGS

For a better understanding of this invention, reference is made to the attached drawings, wherein.

DETAILED DESCRIPTION OF PREFERRED EMBODIMENTS

This invention will be explained in detail, with reference to the attaching drawings, hereinafter.

A Solution to be Optically Treated

The solution to be optically treated according to the present invention includes the cyclopentanone solvent, the PMGI and the light absorption dye.

The solution can form a film, particularly an antireflection film, capable of dissolving in an alkaline developer which is used in a photoresist developing without the intermixing with the photoresist. A water solution including 2.38%-tetramethylammoniumhydroxide (hereinafter, abbreviated to a "TMAH") is exemplified as the alkaline developer.

The PMGI is represented by the following chemical constitutional formula:

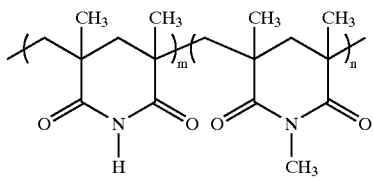

Herein, the PMGI resin has a molecular weight (Mw) of about 1000–30000 and a compositional ratio (m:n) of about 50:50.

An azobenzene-based dye may be exemplified as the light absorption dye in the present invention. Concretely, the azobenzene-based dye be represented by the following chemical constitutional formula:

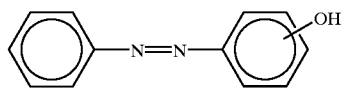

The dye absorbs a g-line and an i-line.

A coumarin-based dye may be also exemplified as the light absorption dye. Concretely, the coumarin-based dye may be represented by the following chemical constitutional formula:

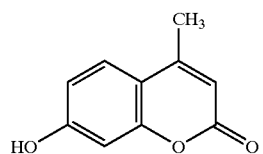

The dye also absorbs a g-line and an i-line.

Another coumarin based dye may be represented by the following chemical constitutional formula:

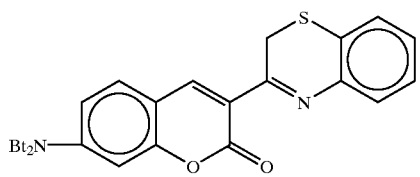

A benzophenone-based dye may be also exemplified as the light absorption dye in the present invention. Concretely, the benzophenone-based dye may be represented by the following chemical constitutional formula:

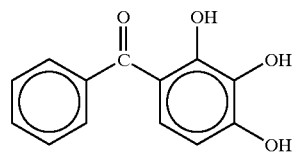

The dye mainly absorbs an i-line.

A Method for Forming an Antireflection Film

In forming the antireflection film using the solution to be optically treated, the solution is applied onto an object body and then, is thermally treated. Thereby, the antireflection film which dissolves in an alkaline developer which is used in a photoresist developing can be provided without the intermixing with the photoresist.

A Pattern-plating Method

Next, the pattern-plating method using the solution to be optically treated will be explained. FIGS. 2–5 are views showing the plating method.

Figure 2:
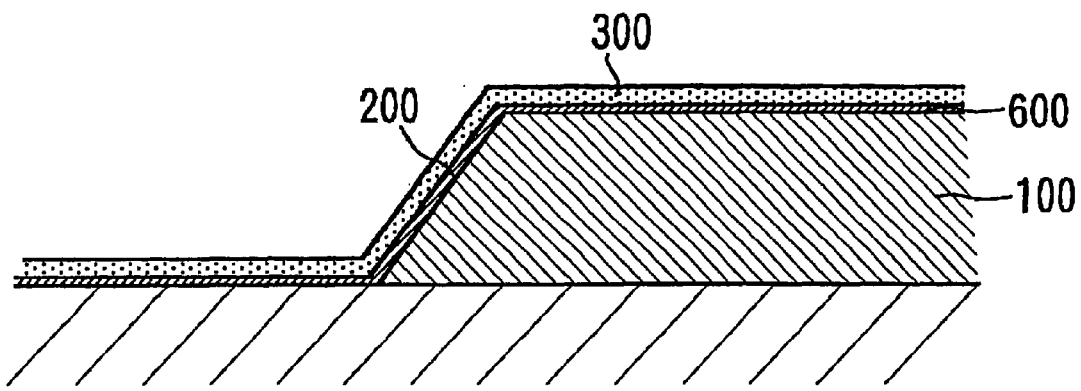
FIG. 2 is a view for explaining a pattern-plating method using the solution to be optically treated.

In performing the pattern-plating method using the above solution to be optically treated, as shown in FIG. 2, after plate-underfilm 600 is formed on a surface of a body to be plated 100 including an inclined portion 200, an antireflection film 300 is formed at least on the plate-underfilm 600 formed on the inclined portion 200. The antireflection film 300 is formed by applying the solution to be optically treated according to the present invention through a spin-coating method, etc. and heating the applied solution. The conditions in the spin-coating are appropriately determined, depending on the concentration etc. of the solution.

Figure 3:
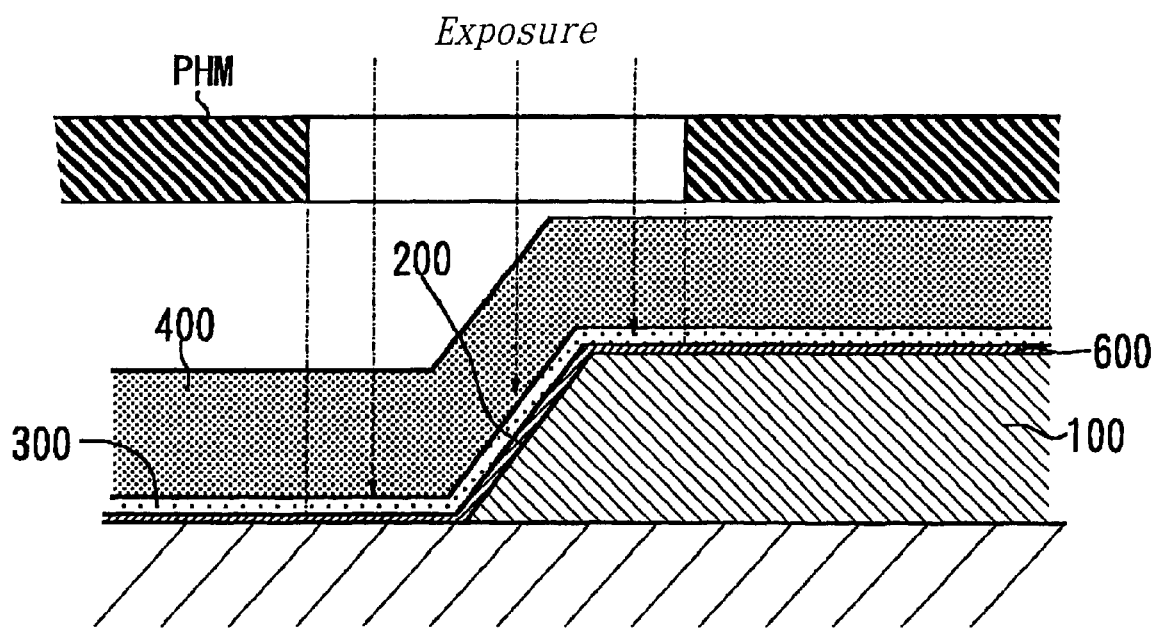
FIG. 3 is a view showing a step after the step depicted in FIG. 2.

Subsequently, as shown in FIG. 3, a photoresist 400 is formed so as to cover the antireflection film 300. Then, a photolithography process is carried out for the photoresist 400 and the antireflection film 300 to form a plate-pattern on the surface of the body to be plated 100. It is well known, the photolithography process is carried out as follows: The photoresist 400 is exposed via a photomask PHM and developed with a give pattern.

Figure 4:
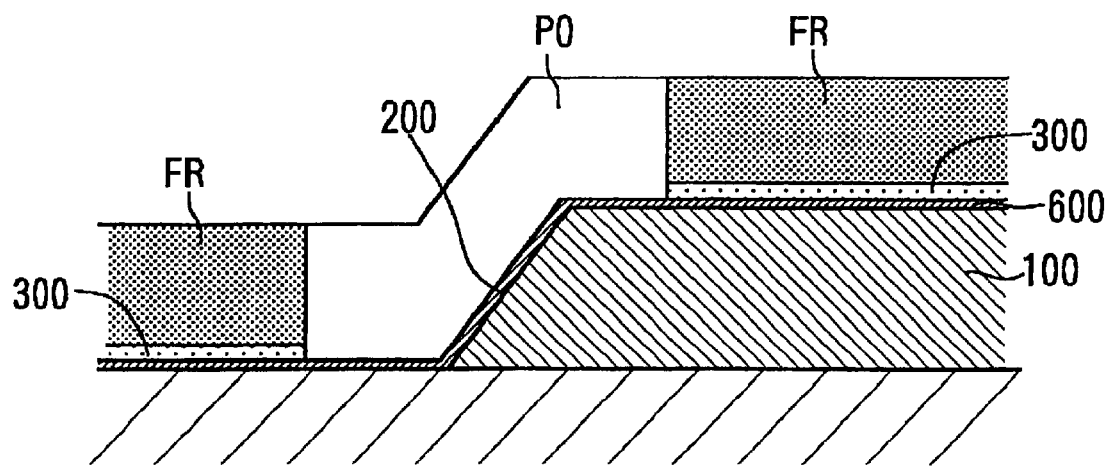
FIG. 4 is a view showing a step after the step depicted in FIG. 3.
Figure 5:
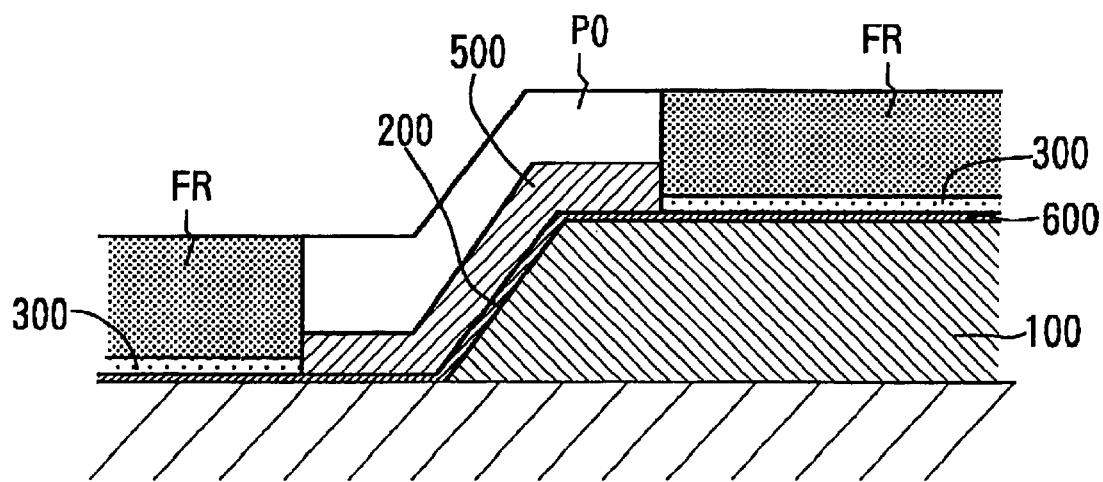
FIG. 5 is a view showing a step after the step depicted in FIG. 4.

The photolithography process can form a resist frame FR having a given pattern P0 composed of the photoresist 400 and the antireflection film 300, as shown in FIG. 4. Thereafter, as shown in FIG. 5, a plate-pattern 500 is formed. After the pattern-plating process, the resist frame FR is removed by dissolving it into an organic solvent, etc. and the unnecessary part of the plate-underfilm 600 around the plate-pattern 500 is removed by such as dry-etching method to form a given plate-pattern.

Since by using the solution to be optically treated, the antireflection film 300 which dissolves in an alkaline developer which is used in a photoresist developing without the intermixing with the photoresist 400, in the resist frame by the photolithography process, the photoresist 400 and the antireflection film 300 can be patterned so as to have their same pattern (see, FIG. 4). Another process to remove the antireflection 300 is not required. Thus, the photolithography can be simplified.

Next, the various compositional ratio of the solution to be optically treated will be explained, with reference to data. Samples 1–6, which have light absorption dye concentrations of 10, 50, 100, 200, 500 and 150 (g/qt) to a PMGI concentration (wt %), were prepared. An antireflection film having A thickness of 0.1 μm was formed from each sample and was held for an hour at a temperature of 200° C. Then, each sample was investigated about its antireflection effect. The thus obtained results are listed in Table. 1.

TABLE 1

| Sample | PMGI concentration (wt %) | Dye concentration (g/qt) | Thickness (μm) | Thermal treatment temperature (° C.) | Thermal treatment period (H) | Antireflection effect |
| --- | --- | --- | --- | --- | --- | --- |
| 1 | 3 | 10 | 0.1 | 200 | 1 | no |
| 2 | 3 | 50 | 0.1 | 200 | 1 | a little |
| 3 | 3 | 100 | 0.1 | 200 | 1 | yes |
| 4 | 3 | 200 | 0.1 | 260 | 1 | yes |
| 5 | 3 | 500 | 0.1 | 200 | 1 | not perfect |
| 6 | 3 | 150 | 0.1 | 130–230 | 1 | yes |

As is shown in Table. 1, Sample 1 having the light absorption dye concentration of 10 (g/qt) does not have the antireflection effect. In Sample 5 having the light absorption dye concentration of 500 (g/qt), the dye constituting the Sample does not dissolve perfectly in the 3 wt % PMGI-cyclopentanone solution. Samples 2–4, 6 have the antireflection effects. Particularly, Samples 3, 4 and 6 having the light absorption dye concentration of 50–200 (g/qt) have extremely antireflection effects. Accordingly, in the 3 wt % PMGI-cyclopentanone solution, the light absorption dye concentration is set with a range of 50–200 (g/qt), preferably a range of 100–200 (g/qt).

Subsequently, the antireflection film obtained from the solution to be optically treated was investigated about its etching speed using a TMAH based alkaline developer. Antireflection films having thicknesses of 0.1 μm formed from Sample 6 as a solution to be optically treated were exposed via a mask. Then, the antireflection films were heated at temperatures of 130° C., 150° C., 180° C., 200° C. and 230° C., respectively in a normal oven. A photo-resist film was applied in a thickness of 1.2 μm onto each antireflection film and was exposed via a mask. The thus obtained samples were dipped into a 2.38%-TMAH alkaline developer and then, developed. The alkaline developer was held at a temperature of 23° C. In the 2.38%-TMAH alkaline developer, the antireflection film has a large etching speed than that of the photoresist film, so that the antireflection has a constriction as the thus obtained resist pattern is viewed in its cross sectional direction (thickness direction). The etching amount of the antireflection film is defined by the constriction width. The thus obtained results are listed in Table. 2.

TABLE 2

| | Etching amount by a developer (nm) | | | | |
| --- | --- | --- | --- | --- | --- |
| | Thermal treatment temperature (° C.) (one hour, conventional oven) | | | | |
| Developing time (second) | 130 | 150 | 180 | 200 | 230 |
| 30 | 320 | 150 | 50 | 5 | not dissolution |
| 60 | 630 | 300 | 100 | 10 | not dissolution |
| 90 | 950 | 440 | 145 | 14 | not dissolution |

As is shown in Table. 2, the antireflection film heated at the temperature of 130° C. for an hour has etching amounts of 320 nm, 630 nm and 950 nm at developing times of 30 seconds, 60 seconds and 90 seconds, respectively. The average value of their etching speed is 10.6 nm/second. That is, the etching amount is almost proportion to the developing time. The antireflection films formed at the temperatures of 150° C., 180° C. and 200° C. have the same tendency as the above-mentioned. Accordingly, only if the antireflection film is formed at the temperature of 130–200° C., its developing etching amount can be controlled by adjusting the developing time.

On the other hand, the antireflection film, formed at a temperature of less than 100° C., is not went solid sufficiently. Moreover, the ant-ireflection film, formed at a temperature of 230° C., does not dissolve in the above alkaline developer. The reason is that the carbonization in the antireflection film proceeds.

Although in the above example, the 3 wt % PMGI-cyclopentanone solution is used in forming the antireflection film, the solution may have a PMGI concentration of 0.1–50 wt %.

The solution to be optically treated and the pattern-plating method according to the present invention can exhibit an extremely operation/working effect in manufacturing a thin film magnetic head. Hereinafter, two kinds of thin film magnetic head will be explained.

A First Embodiment-thin Film Magnetic Head

Figure 6:
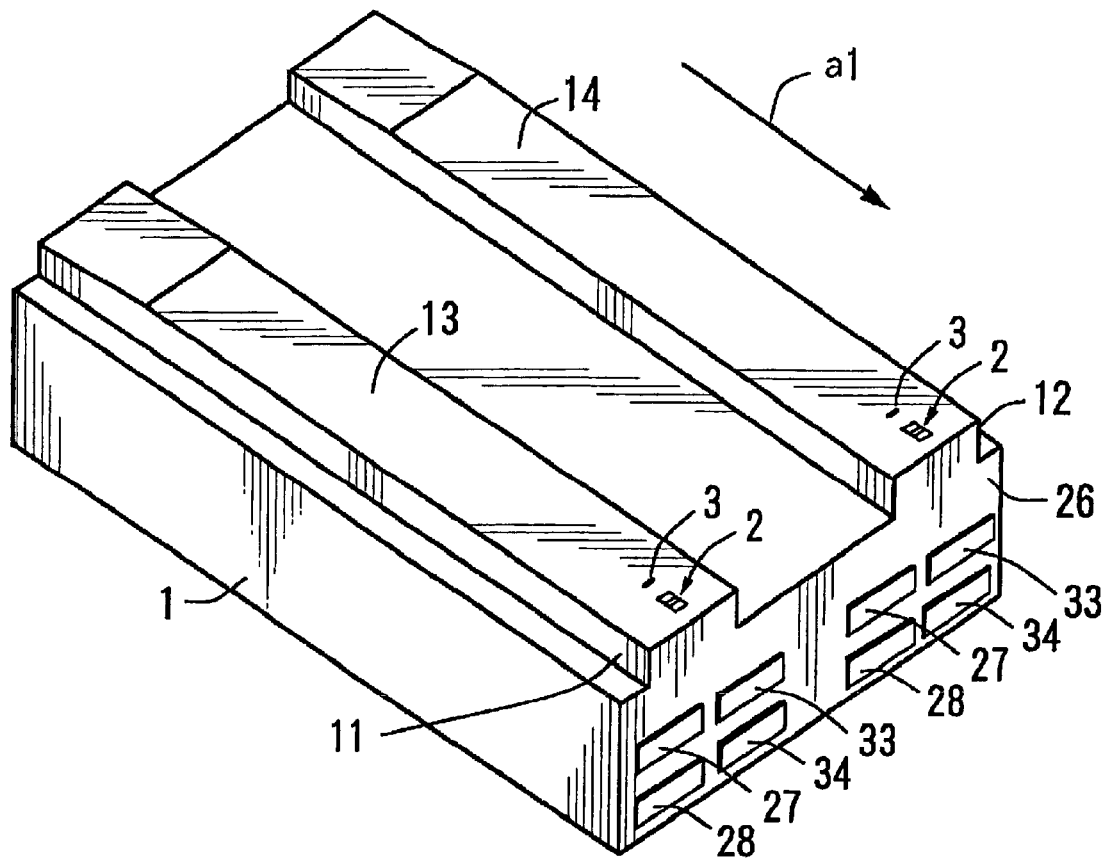
FIG. 6 is a perspective view showing an embodiment of the thin film magnetic head according to the present invention.
Figure 7:
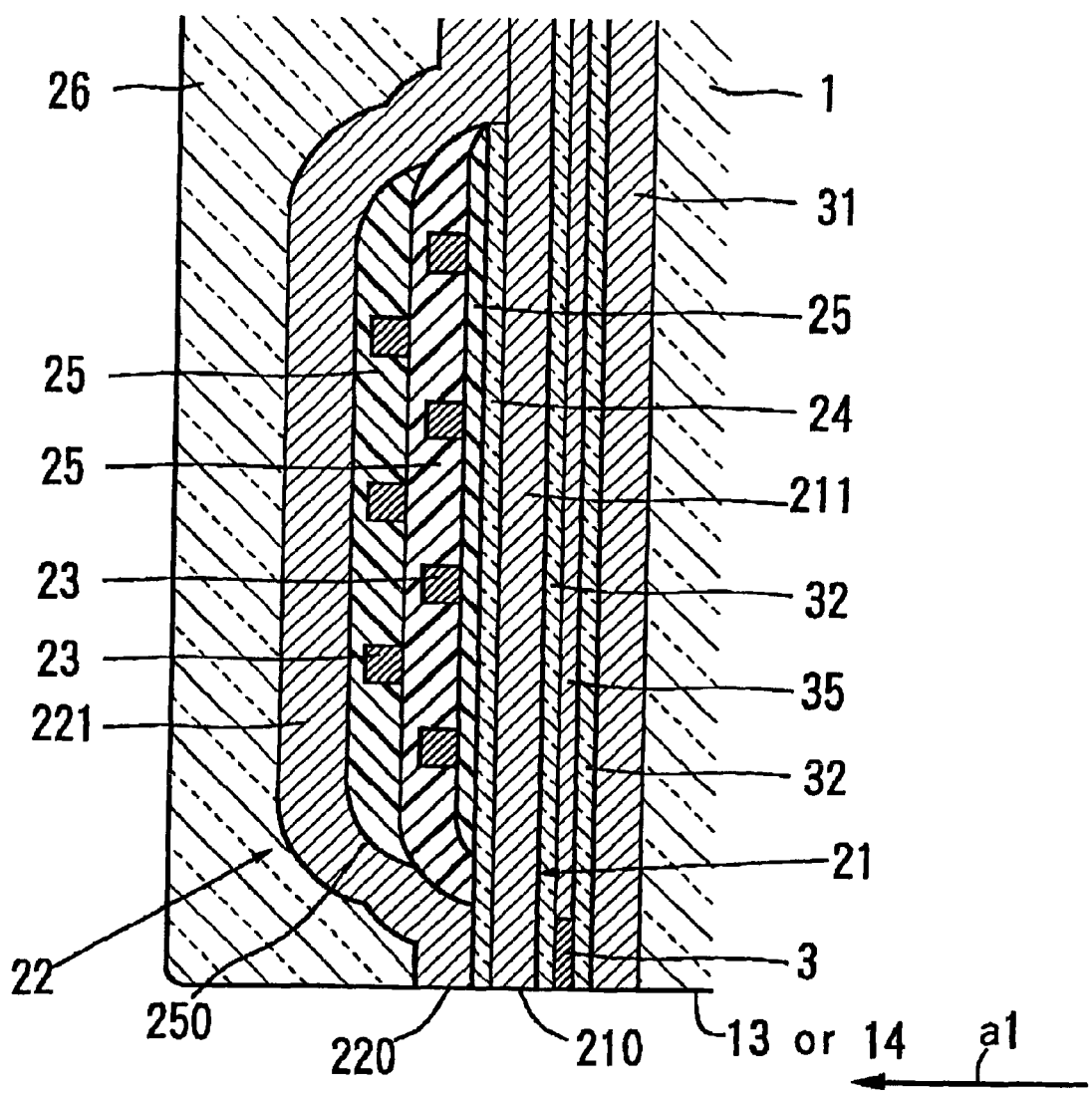
FIG. 7 is a cross sectional view of the thin film magnetic head depicted in FIG. 6.

FIG. 6 is a perspective view of a first embodiment of the thin film magnetic head according to the present invention and FIG. 7 is a cross sectional view of the thin film magnetic head depicted in FIG. 6. In these figures, the sizes of the parts are exaggerated. The thin film magnetic head shown in these figures has slider 1 and at least one inductive type thin film magnetic conversion element 2.

The slider 1 has rail parts 11 and 12, of which substrate surfaces 13 and 14 serve as an air bearing surface (hereinafter, abbreviated to a "ABS"), on its opposing surface to a recording medium. The slider 1 does not always have the two rail parts 11 and 12, and may have one through three rail parts or no rail part. Moreover, for improving its floating characteristic, the slider may have a variety of geometrically designed opposing surface. The present invention may be applied for any kind of slider. The slider 1 is made of a ceramic material such as AlTiC.

The inductive type thin film magnetic conversion element 2, formed on the slider 1, includes a first magnetic film 21, a gap film 24, a second magnetic film 22, a coil film 23, an insulating film 25 and a protective film 26. The first magnetic film 21 has a first pole portion 210 and a first yoke portion 211. The first pole portion 210 is composed of the end portion of the first magnetic film in the side of the ABSs 13 and 14.

The first yoke portion 211 is connected to the first pole portion 210 continuously and extended from the ABSs 13 and 14 to the backward of the first pole portion 210. The coil film 23 is supported by the insulating film 25. The gap film 24 is provided at least on the first pole portion 210.

The insulating film 25 supports the coil film 23, positioning above the first yoke portion, and has a rising inclined portion from the surface of the gap film 24 in the side of the ABSs 13 and 14. The inclined portion has its arc-like surface corresponding to the number of then insulating film 25.

The second magnetic film 22 has a second pole portion 220 and a second yoke portion 221. The second pole portion 220 is opposite to the first pole portion 210 via the gap film 24. The second yoke portion 221 is provided on the insulating film 25, connecting to the second pole portion 220 continuously, and coupled to then first yoke portion at its backward.

The first magnetic film 21, the gap film 24, the second magnetic film 22, the coil film 23, the insulating film 25 and the protective film 26 may be formed, of materials well known to a person skilled in the art, in an ordinary thicknesses and patterns by a normal means. The favorable examples will be described as follows:

First of all, the first magnetic film 21 is formed, of a soft magnetic material such as NiFe, CoFe, CoFeNi, in a thickness of about 0.5–4 $\mu$m. The forming means is a plating method, a sputtering method or the like.

Then second magnetic film 22 is formed, of a soft magnetic material such as NiFe, CoFe, CoFeNi, in a thickness of about 3–5 $\mu$m. The forming means is a frame-plating method, etc. The method for manufacturing the thin film magnetic head including the first magnetic film, etc. will be described in detail.

The coil film 23 is made of a conductive material such as Cu. The coil film 23 preferably has a thickness of 2–5 $\mu$m. The coil film 23 is formed by a frame-plating method, etc.

The gap film 24 may be made of a nonmagnetic insulating material such as $Al_2O_3$, $SiO_2$ or a nonmagnetic metallic material. In using the nonmagnetic insulating material such as $Al_2O_3$, $SiO_2$, the gap film 24 may be formed by a sputtering method, etc. In using the nonmagnetic metallic material, the gap film may be formed by a plating method or a sputtering method. The gap film preferably has a thickness of about 0.01–0.5 $\mu$m.

The insulating film 25 is preferably formed by hardening, a photoresist material. The layer number and the thickness of the insulating film 25 varies, depending on the number of the coil film 23 and the coil-supporting structure. Generally, the film 25 has a thickness of about 3–20 $\mu$m.

The protective film 26 may be made of an insulating material such as $Al_2O_3$, $SiO_2$. The film 26 preferably has a thickness of 5–50 $\mu$m. The film 26 may be preferably formed by a sputtering etc.

The coil film 23 constitutes a thin film magnetic circuit with the first and the second magnetic films 21, 22 and the gap film 24. The coil film 23 is supported by the insulating film 25 and is wound vertically around the connection of the yoke portions. Both ends of the coil film 23 are conductively connected to pull-out electrodes 27 and 28 (see, FIG. 6). The winding number of the layer number of the coil film 23 are not restricted. In the example, the coil film 23 has two-layered structure.

In the thin film magnetic head shown in those figures, the slider 1 has the ABSs 13 and 14 and the thin film magnetic conversion element 2 on the slider 1, so that the magnetic head constitutes a floating type thin film magnetic head for a magnetic recording medium such as a magnetic disk.

Since the second yoke portion of the second magnetic film 22 is magnetically coupled to the first magnetic film 21 at its backward, a magnetic field generated by flowing a current in the coil film 23 can be effectively transmitted to the first pole portion 210 and the second pole portion 220 via the second yoke portion 221.

The thin film magnetic film shown in FIGS. 6 and 7 has the inductive type magnetic conversion element 2 for writing and a MR element 3 for reading.

The thin film electromagnetic conversion elements 2 and 3 are provided on the end portions of one or both of the rail parts 11 and 12 in a medium-moving direction a1, which corresponds to an outflow direction of an air at a high speed movement of the medium. On the end of the slider 1 in the medium-moving direction a1 are the pull-out electrodes 27 and 28 connected to the thin film electromagnetic conversion element 2 and the pull-out electrodes 33 and 34 connected to the thin film electromagnetic conversion element 3.

As of now, the MR element 3 having any kind of film-structure is suggested and is practically used. For example, the MR element may be composed of an anisotropic magnetic resistive effective element made of permalloy, etc., a giant magnetic resistive (GMR) effective film and a ferromagnetic tunnel effective film (TMR), etc. In the present invention, all the above film-structure may be employed. The MR element 3 is positioned on the insulating film 32 between a first shielding film 31 and the first magnetic film 21 doubling as a second shielding film. The insulating film 32 is made of alumina, etc. The MR element 3 is connected to pull-out electrodes 33 and 34 (see, FIG. 6) via a leading conductor 35 (see, FIG. 7).

A Method for Manufacturing a First Embodiment-
thin Film Magnetic Head

Next, the thin film magnetic head in the first embodiment, shown in FIGS. 6 and 7, will be explained. FIGS. 8–25 are views showing the steps in the manufacturing method of the thin film magnetic head in the first embodiment. The similar parts in FIGS. 8–25 to ones in FIGS. 6 and 7 are designated by the same reference numbers. Although the manufacturing method according to the present invention is carried out on a wafer, in these figures, the manufacturing method is performed for one element on the wafer.

Figure 8:
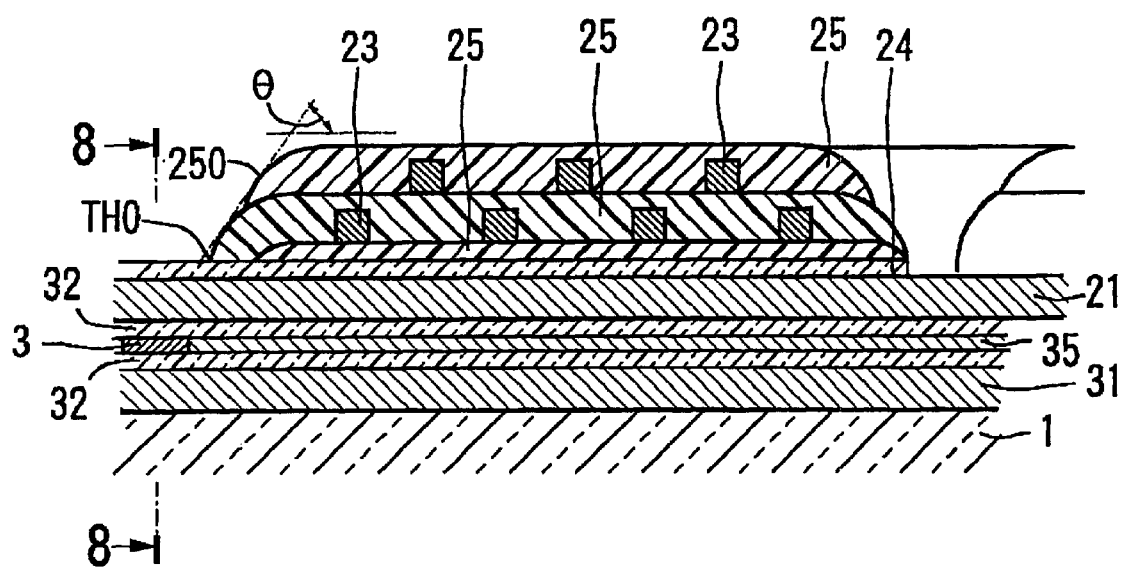
FIG. 8 is a cross sectional view showing a manufacturing step of the thin film magnetic head shown in FIGS. 6 and 7.
Figure 9:
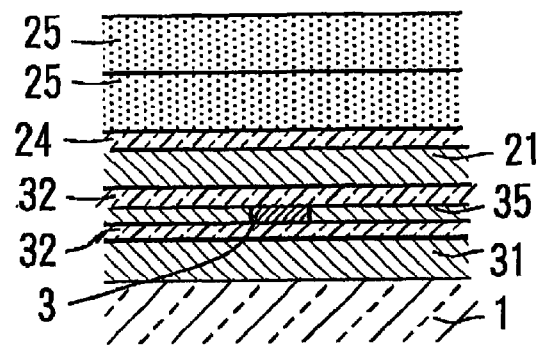
FIG. 9 is a cross sectional view taken on line "8—8" of FIG. 8.
Figure 10:
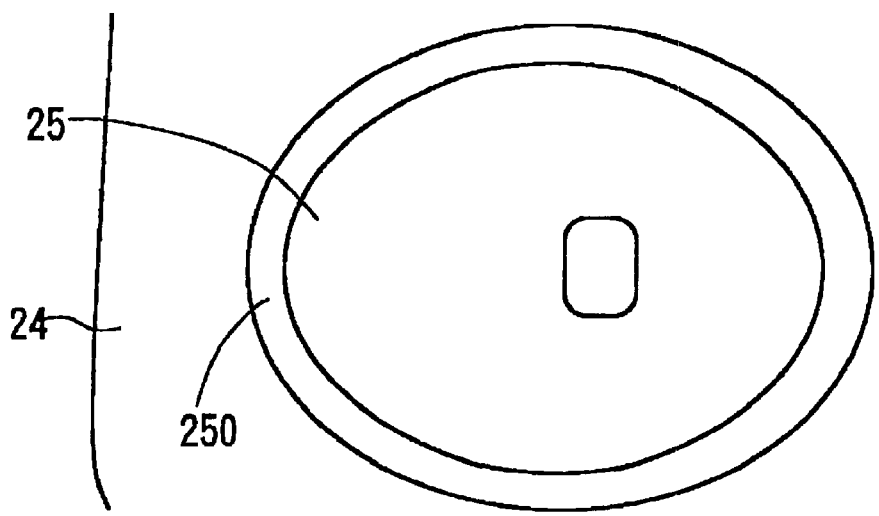
FIG. 10 is a plan view of the thin film magnetic head shown in FIGS. 8 and 9.

First of all, the manufacturing method will be described, with reference to FIGS. 8–10. FIG. 8 is an elevational section view of the magnetic conversion element in the thin film magnetic head in a step and FIG. 9 is a cross sectional view, taken on line "8—8" of FIG. 8. FIG. 10 is a plan view of the magnetic conversion element shown in FIGS. 8 and 9. For clarification, the sizes of some parts in the thin film magnetic head in each figure are not always same and are exaggerated.

In these figures, the first magnetic film 21, the gap film 24, the coil film 23 and the insulating film 25 are already formed on a substrate 1 to be the slider.

A plate-underfilm (seed film) to plate-form the second magnetic film, not shown in the figures, is formed over the whole surface of the assembly including the insulating film 25. The MR element 3, the first shielding film 31, the insulating film 32 and the leading conductor 35 etc. are already formed. These constituting parts may be formed by well known process to a person skilled on the art.

The insulating film 25 has a rising inclined portion 250 with an inclination of at a given angle from the surface of the gap film 24. The rising start point of the inclined portion 250 corresponds to a Throat Height zero point TH0 and the rising angle $\theta$ corresponds to an Apex Angle. The angle $\theta$ is preferably 10–60 degrees, more preferably 30–45 degrees.

Figure 11:
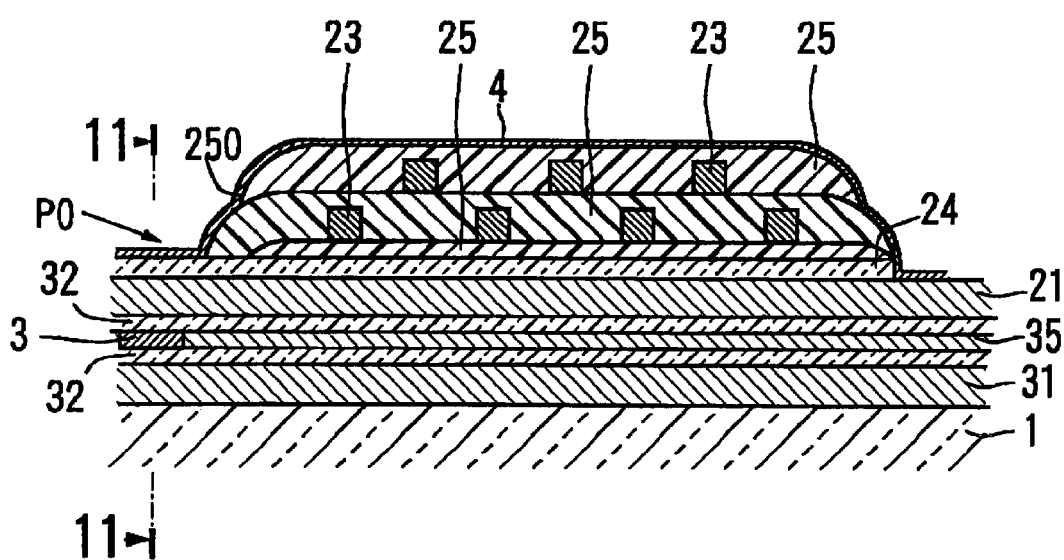
FIG. 11 is a cross sectional view showing a step after the step shown in FIGS. 8–10.
Figure 12:
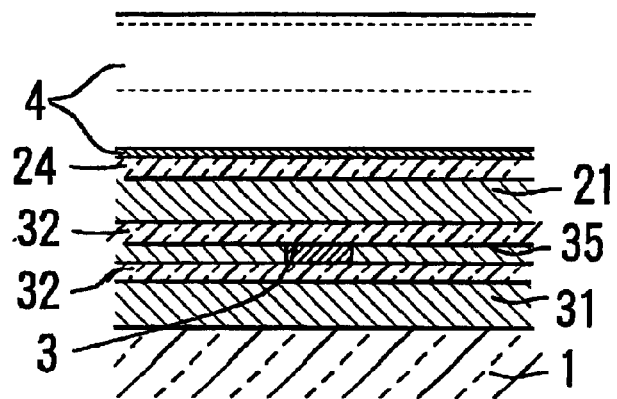
FIG. 12 is a cross sectional view taken on line "11—11" of FIG. 11.
Figure 13:
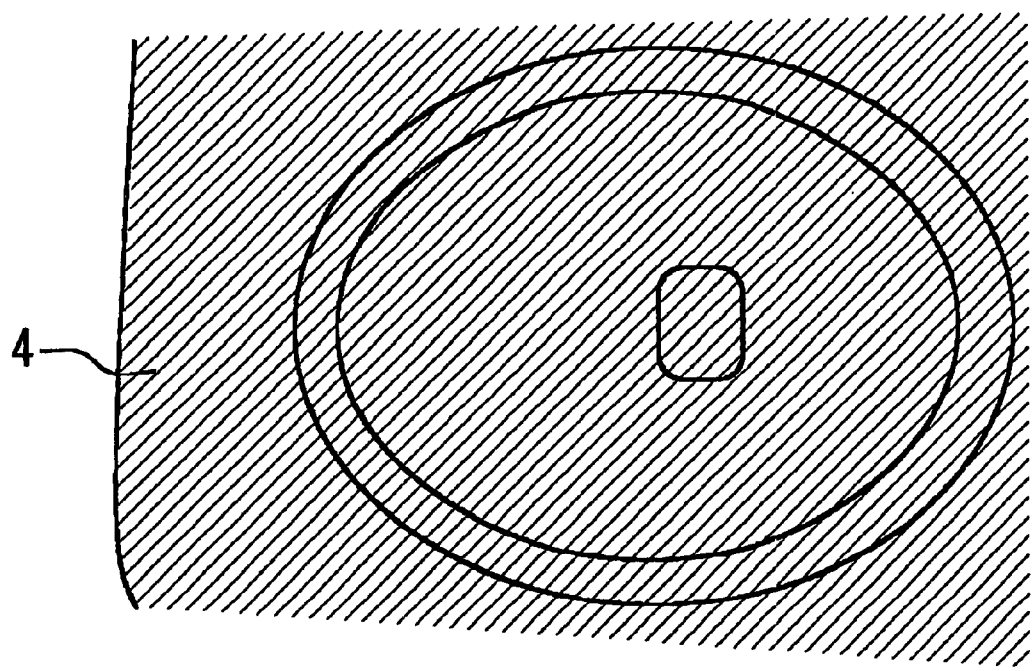
FIG. 13 is a plan view of the thin film magnetic head shown in FIGS. 11 and 12.

Subsequently, as shown in FIGS. 11–13, the antireflection film 4 is formed. The antireflection film 4 is formed, of the solution to be optically treated as above-mentioned, on the whole surface of the insulating film 25 and the exposed surfaces of the first magnetic film 21 and the gap film 24 by a spin coating method, etc. The antireflection film 4 is formed on the conditions (the compositional ratio of the solution to be optically treated, the heating temperature, etc.) as above-mentioned.

Figure 14:
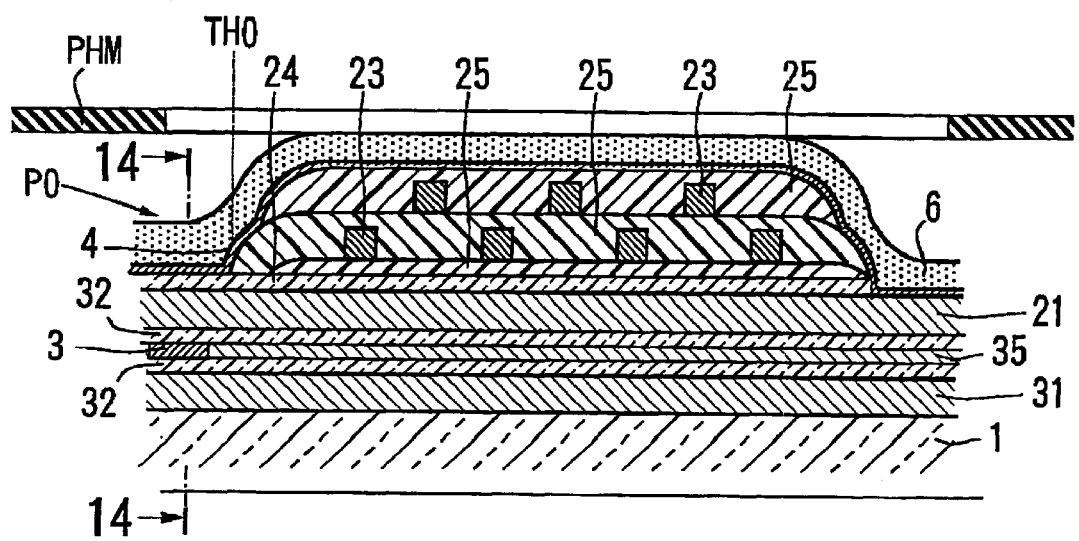
FIG. 14 is a cross sectional view showing a step after the step shown in FIGS. 11–13.
Figure 15:
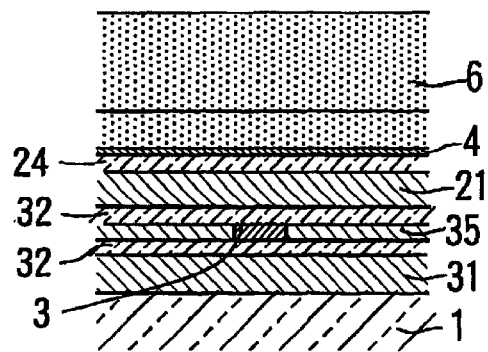
FIG. 15 is a cross sectional view taken on line "14—14" of FIG. 14.
Figure 16:
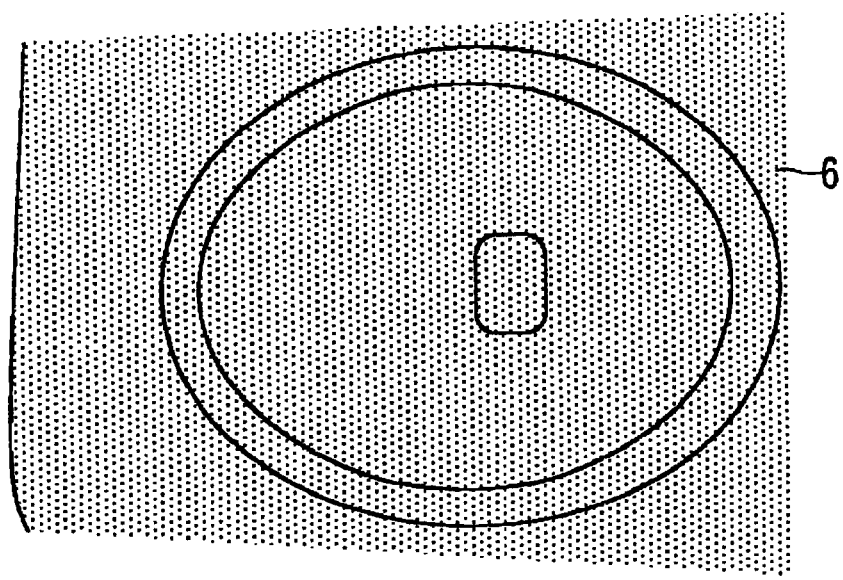
FIG. 16 is a plan view of the thin film magnetic head shown in FIGS. 14 and 15.
Figure 17:
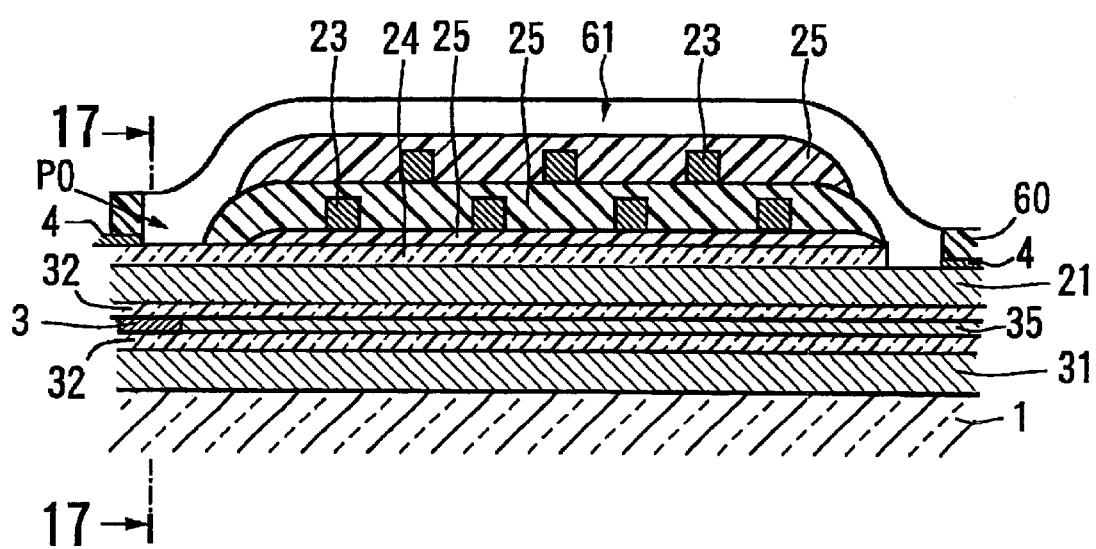
FIG. 17 is a cross sectional view showing a step after the step shown in FIGS. 14–16.
Figure 18:
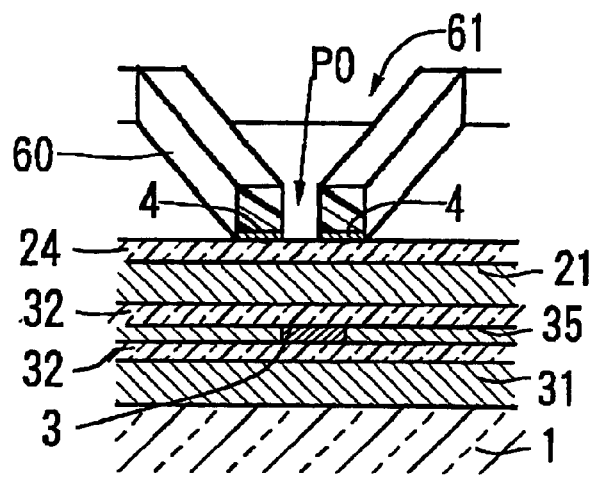
FIG. 18 is a cross sectional view taken on line "17—17" of FIG. 17.
Figure 19:
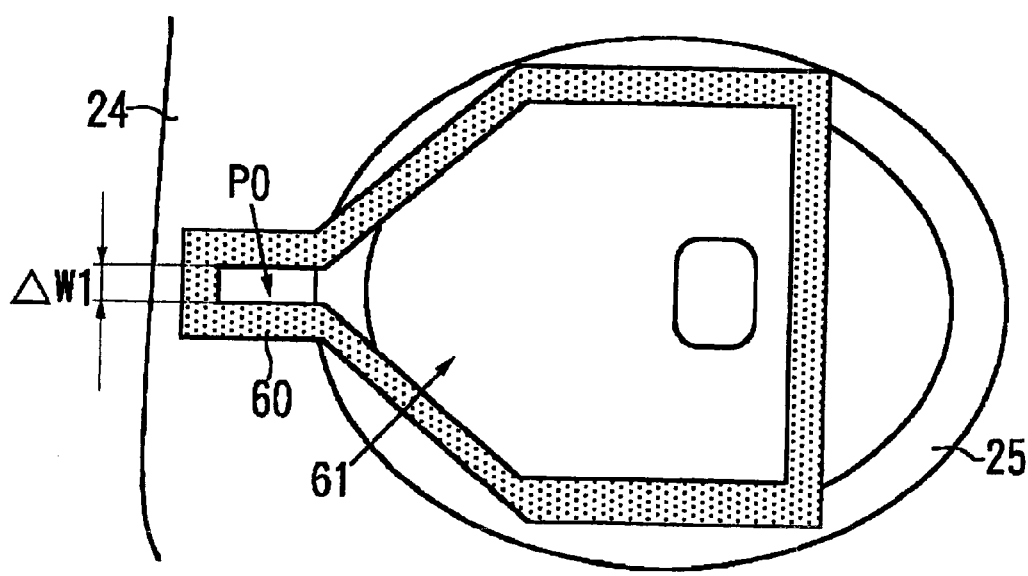
FIG. 19 is a plan view of the thin film magnetic head shown in FIGS. 17 and 18.

Next, as shown in FIGS. 14–16, the photoresist 6 is applied to cover the antireflection film 4 and the insulating film 25. The photoresist 6 may be applied by a spin coating method. The photomask PHM is set on the photoresist 6 and the photolithography process is carried out for forming the second magnetic film. Thereby, as shown in FIGS. 17–19, a resist frame 60 having a given pattern 61 is formed.

Herein, since the inclined portion 250 ranging the pole portion has the antireflection film 4, in the photolithography process for forming the second magnetic film, an exposing light almost never reflects at the plate-underfilm formed on the inclined portion 250 of the insulating film 25. Accordingly, the exposed pattern of the second pole portion area P0 is almost defined by the exposing pattern of the photomask PHM, so that the pole portion area P0 in the interior pattern 61 surrounded by the resist frame 60 is formed in a precise shape which is defined by the precision of the photolithography process.

Figure 1:
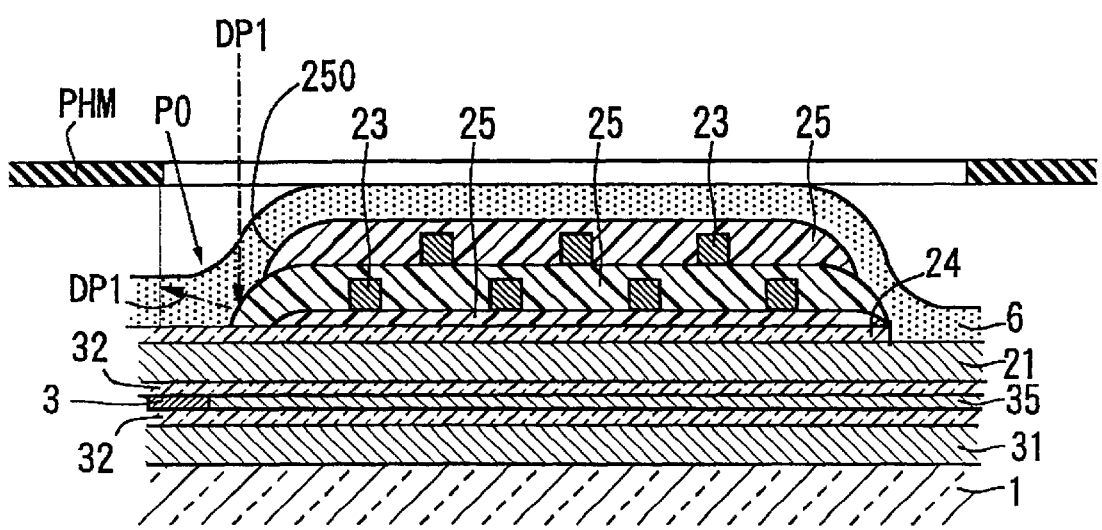
FIG. 1 is a cross sectional view explaining a problem in a conventional method for forming an antireflection film.

FIG. 1 shows a conventional thin film magnetic head not having the antireflection film. In this case, an exposing light DP1 is reflected at the already formed plate-underfilm. The part of the reflected exposing light DP1 reaches the pole portion. As a result, the exposed pattern of the pole portion is different from that of the photomask PHM, resulting in the degradation of the pattern in the resist frame corresponding to the pole portion.

Furthermore, since by using the solution to be optically treated, the antireflection film 4 which dissolves in an alkaline developer which is used in a photoresist developing can be formed without the intermixing with the photoresist, in forming the resist frame by the photolithography process, the photoresist 6 and the antireflection film 4 can be patterned at the same time so as to have their the same pattern. Thus, the photolithography process can be simplified.

Moreover, since the antireflection film 4 is removed with the photoresist 6 in the developing process, the process to remove only the antireflection film 4 is not required. Thus, the degradation of the pattern precision of the resist frame and the decrease of the height of the resist frame, due to the difference in the etching rates between the second yoke portion and the second pole portion, are prevented. Consequently, the second pole portion and the second yoke portion can be formed in a high precise pattern.

Figure 20:
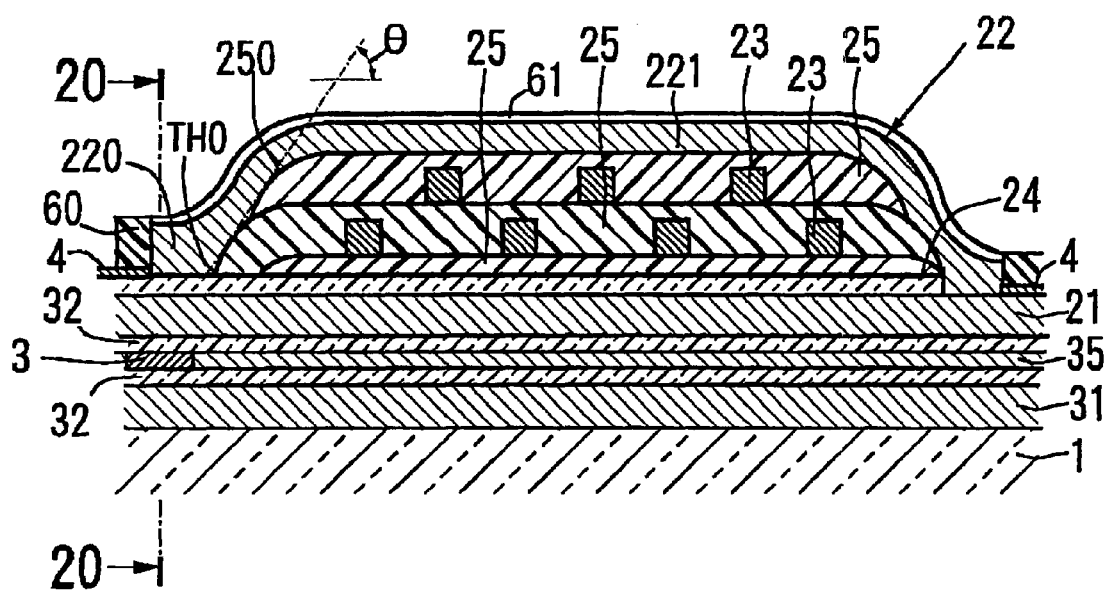
FIG. 20 is a cross sectional view showing a step after the step shown in FIGS. 17–19.
Figure 21:
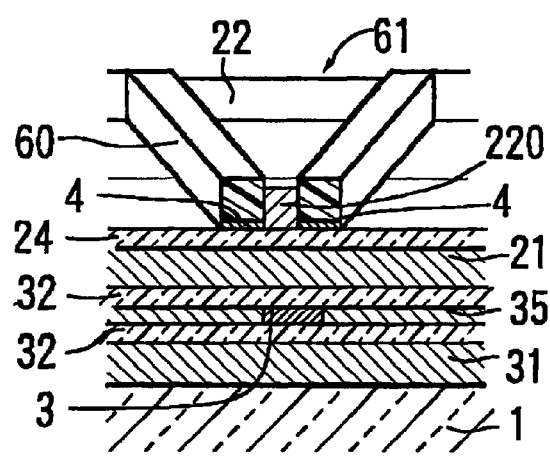
FIG. 21 is a cross sectional view taken on line "20—20" of FIG. 20.
Figure 22:
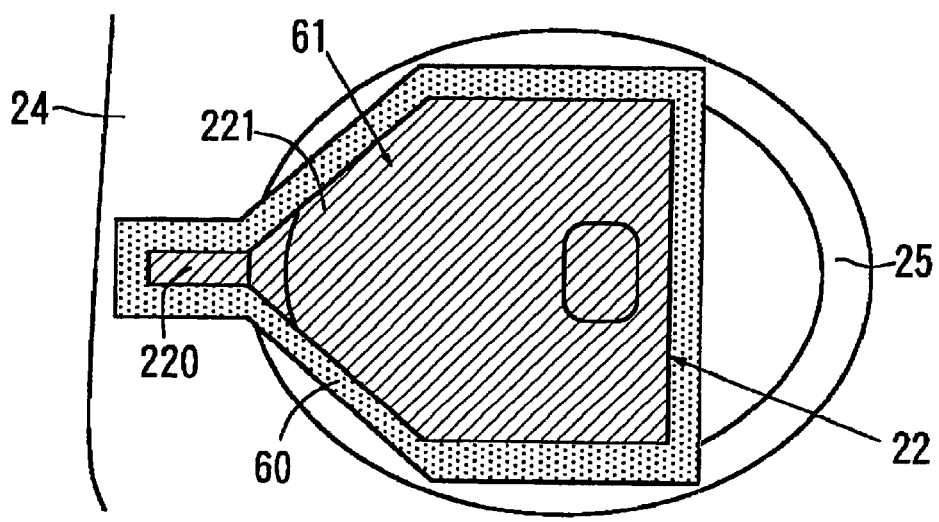
FIG. 22 is a plan view of the thin film magnetic head shown in FIGS. 20 and 21.

Subsequently, as shown in FIGS. 20–22, the second magnetic film 22 is formed in the pattern 61 surrounded by the resist frame 60. The second magnetic film 22 constitutes the second pole portion 220 parallel to the gap film 24 and the first magnetic film 21 up to the Throat Height zero point and is inclined at the Apex Angle θ upward along the insulating film 25 from the Throat Height zero point.

Herein, the resist frame 60 to define the second pole portion 220 (pole portion area P0) has a high precise size and shape which are almost determined by the exposing pattern of the photomask, the second pole portion 220 can have a high precise pattern. Moreover, since the pattern 61 of the resist frame 60 corresponding to the second pole portion 220 is formed high precisely, the thin film magnetic head having a narrowed recording track width of not more than 1.0 μm can be obtained.

Figure 23:
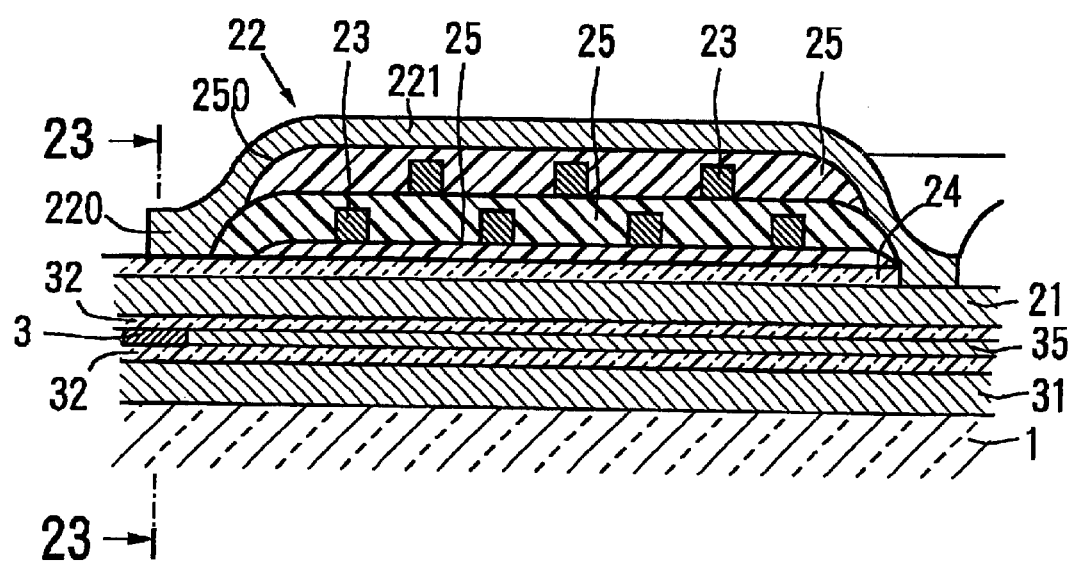
FIG. 23 is a cross sectional view showing a step after the step shown in FIGS. 20–23.
Figure 24:
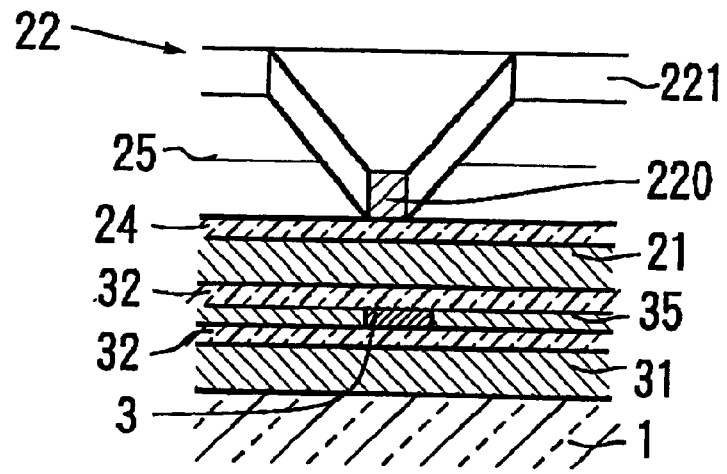
FIG. 24 is a cross sectional view taken on line "23—23" of FIG. 23.
Figure 25:
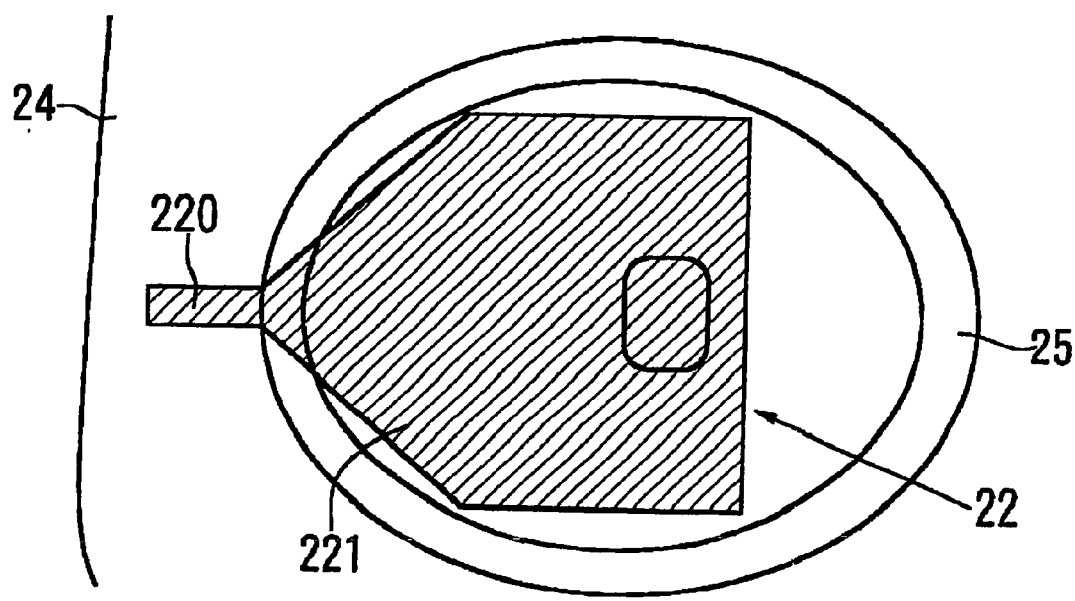
FIG. 25 is a plan view of the thin film magnetic head shown in FIGS. 23 and 24.

Next, as shown in FIGS. 23–25, the resist frame 60 is removed. The resist frame 60 may be removed by a dissolution method using an organic solvent or a dry-etching method such as ashing. Then, the plate-underfilm, not shown in those figures, is removed by a dry-etching method such as milling.

The pole portion composed of the first magnetic film 21, the gap film 24 and the second magnetic film 22 may have various structures and embodiments. This invention can be widely applied for such a pole portion.

Moreover, in this example, the manufacturing method is carried out for the composite type thin film magnetic head having the inductive type magnetic conversion element 2 for writing and the MR element 3 for reading. Thus, the method includes the steps for forming the MR element 3. The MR element 3 is formed before forming the inductive type magnetic conversion element 2.

Needless to say, the steps, not shown, to obtain the complete thin film magnetic head shown in FIGS. 6 and 7 are performed after the steps of FIGS. 8–25. In these steps, conventionally known step may be employed.

A Second Embodiment-SA Type Thin Film Magnetic Head

Figure 26:
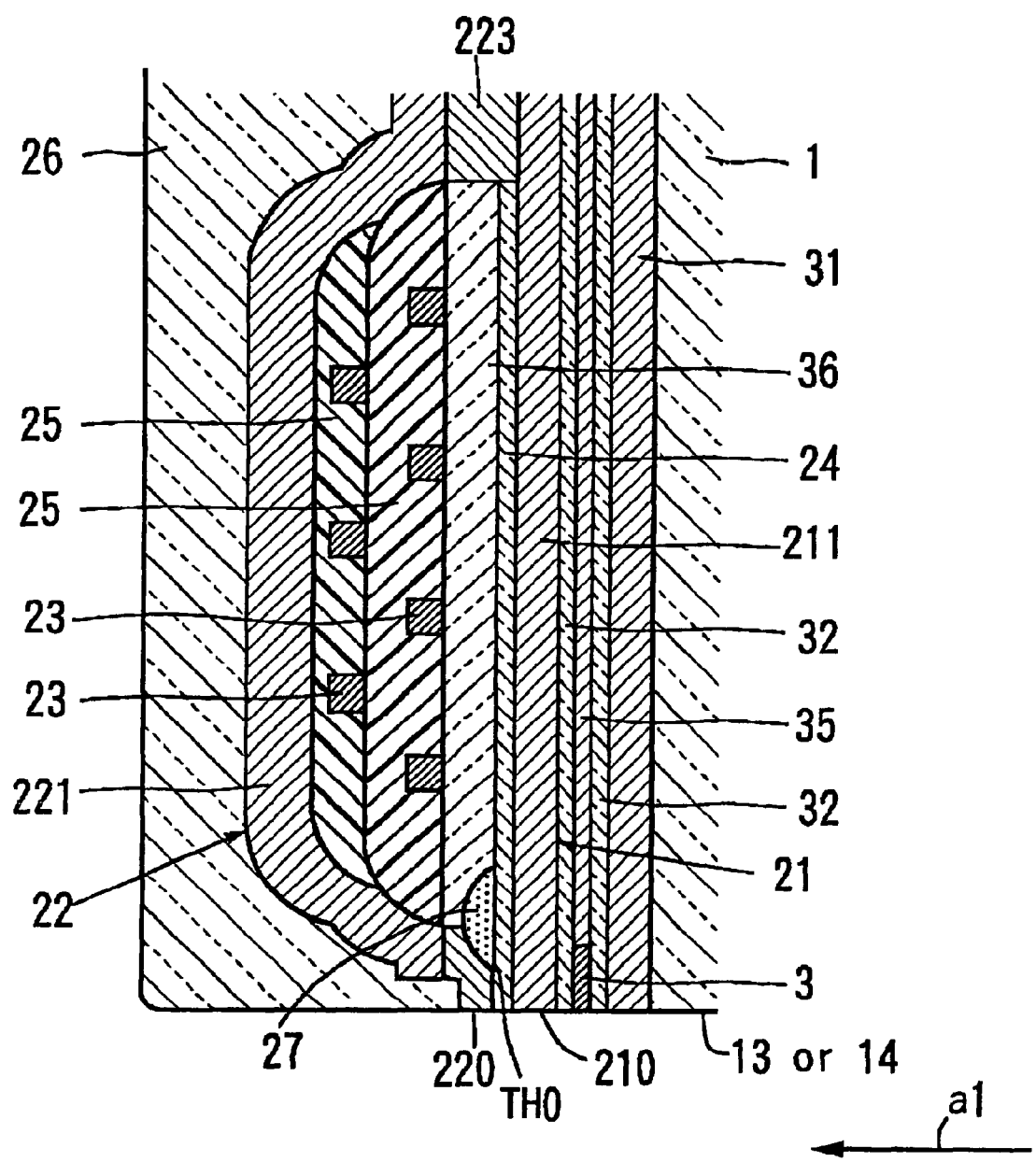
FIG. 26 is a cross sectional view showing another embodiment of the thin film magnetic head according to the present invention.
Figure 27:
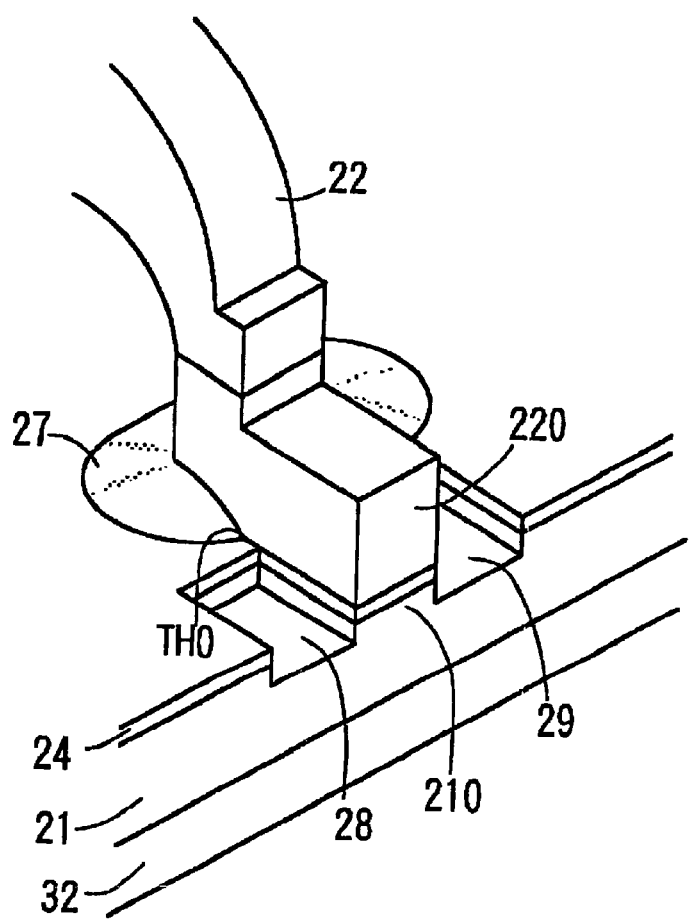
FIG. 27 is a perspective view on an enlarged scale showing the pole portion of the thin film magnetic head shown in FIG. 26.

FIG. 26 is a cross sectional view of a SA type thin film magnetic head in the second embodiment and FIG. 27 is a perspective view on an enlarged scale of the pole portion in the SA type thin film magnetic head shown in FIG. 26. The similar parts in FIGS. 26 and 27 to ones in FIGS. 6 and 7 are designated by the same reference numbers, respectively. In the SA type thin film magnetic head, the insulating film includes a first insulating film 25 and a second insulating film 27. The first insulating film 25 supports the coil film 23. The second insulating film 27 is provided on the base of the first insulating film 25 in the side of the ABSs 13 and 14 and defines the Throat Height=0.

Moreover, in the second magnetic film 22, the second yoke portion 221 is positioned on the first insulating film 25, its one end being connected to the second pole portion 220 continuously, its other end being coupled to the first yoke portion 211 with the backward connecting part 223. In both sides of the first pole portion 210 are provided depressed portions 28 and 29, which narrows the track width.

A Method for Manufacturing a Second Embodiment-SA Type Thin Film Magnetic Head

Figure 28:
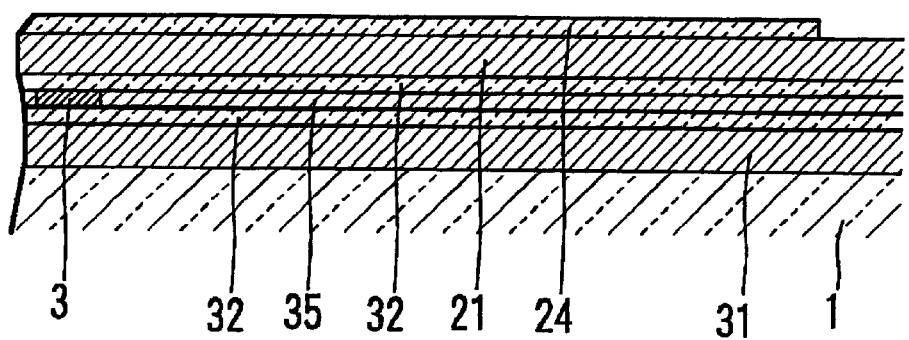
FIG. 28 is a cross sectional view showing a manufacturing step of the thin film magnetic head shown in FIGS. 26 and 27.
Figure 29:
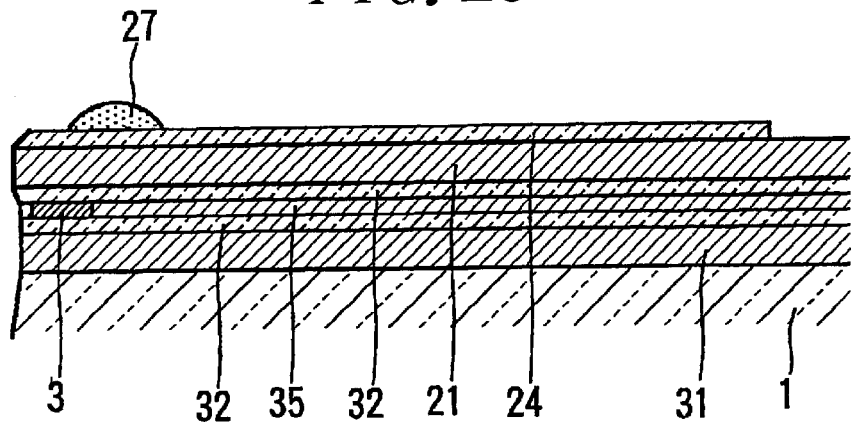
FIG. 29 is a cross sectional view showing a step after the step shown in FIG. 28.

Next, the manufacturing method of the SA type thin film magnetic head in the second embodiment will be explained, with reference to FIGS. 28–36. First of all, after the first magnetic film 21 and the gap film 24 are formed as shown in FIG. 28, the second insulating film 27 is formed in a hemispheric shape etc. on the second insulating film. 27 as shown in FIG. 29. At the time of forming the second insulating film 27, the first insulating, film 25 and the second magnetic film 22 are not formed, yet. The plate-underfilm (seed film) to plate-form the second magnetic film is formed the whole surface of the assembly including the second insulating film 27.

Figure 30:
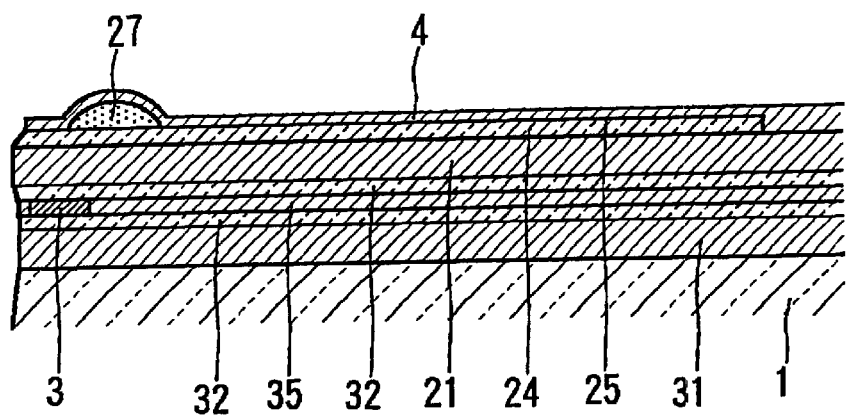
FIG. 30 is a cross sectional view showing a step after the step shown in FIG. 29.

Subsequently, as shown in FIG. 30, the antireflection is formed so as to cover the second insulating film 27. The antireflection film 4 is formed, of the solution to be optically treated according to the present invention, by the favorable process conditions as above-mentioned.

Figure 31:
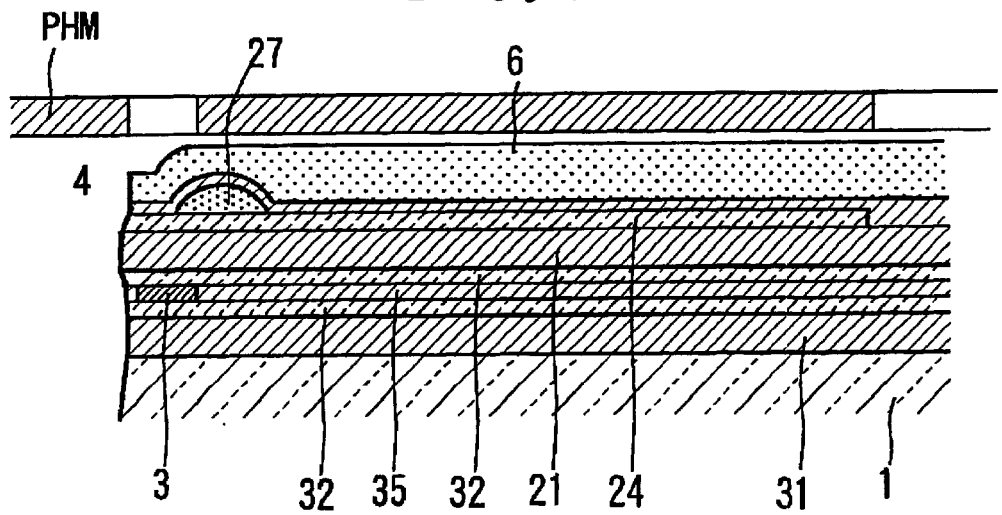
FIG. 31 is a cross sectional view showing a step after the step shown in FIG. 30.
Figure 32:
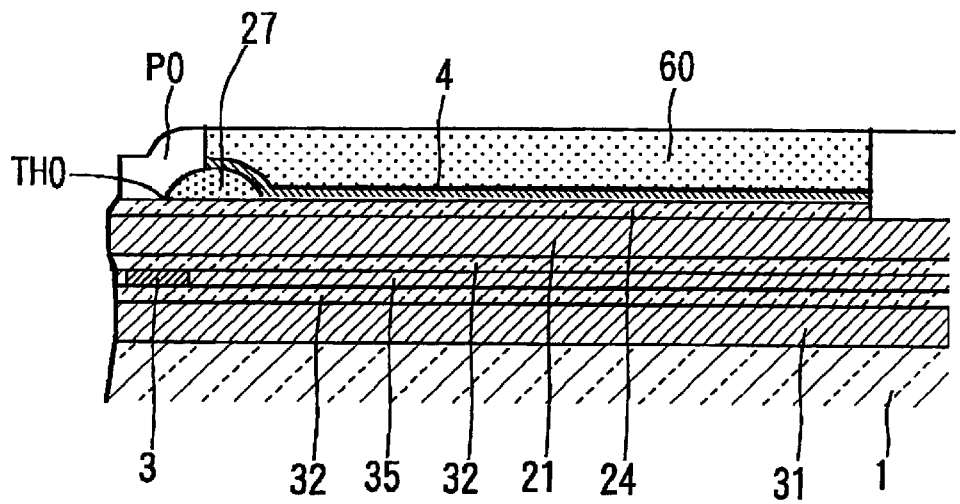
FIG. 32 is a cross sectional view showing a step after the step shown in FIG. 31.

Next, as shown in FIG. 31, the photoresist is applied so as to cover the antireflection film 4 and is exposed with the photomask PHM. Thereafter, the photolithography process is carried out for forming the second pole portion 220 and then, the resist frame 60 is formed, as shown in FIG. 32.

Since in the exposing process, the antireflection film 4 exists on the second insulating film 27 to define the Throat Height zero point THO, in performing the photolithography process to form the second pole portion for the photoresist 6, an exposing light almost never reflects at the second insulating film 27. Accordingly, the exposed pattern of the second pole portion area P0 is almost defined by the exposing pattern of the photomask PHM, so that the pole portion area P0 in the interior pattern 61 surrounded by the resist frame 60 is formed in a precise shape which is defined by the precision of the photolithography process.

Moreover, since by using the solution to be optically treated, the antireflection film 4 which dissolves in an alkaline developer which is used in a photoresist developing can be formed without the intermixing with the photoresist, in forming the resist frame 60 by the photolithography process, the photoresist 6 and the antireflection film 4 can be patterned at the same time so as to have their the same pattern. Thus, the photolithography process can be simplified.

Figure 33:
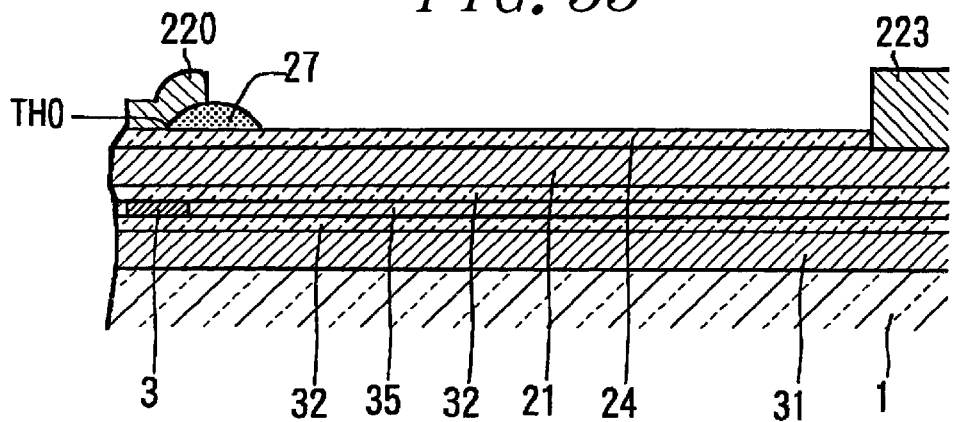
FIG. 33 is a cross sectional view showing a step after the step shown in FIG. 32.
Figure 34:
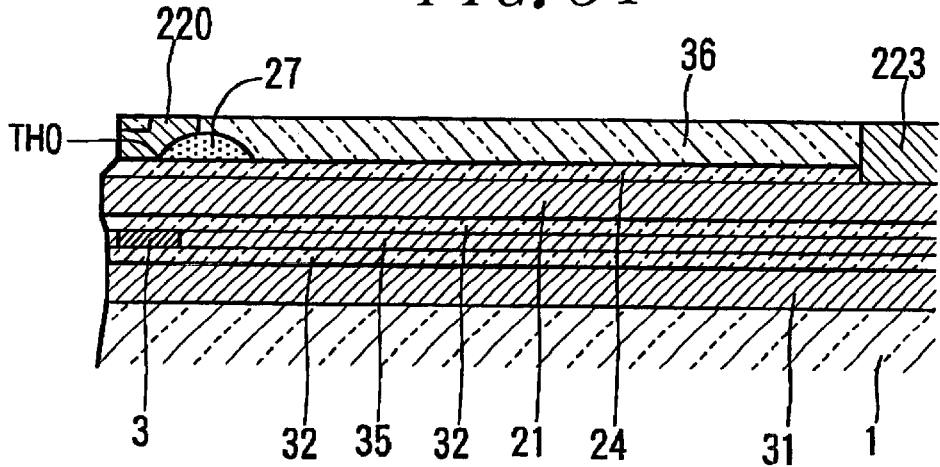
FIG. 34 is a cross sectional view showing a step after the step shown in FIG. 33.

Subsequently, as shown in FIG. 33, the second pole portion 220 is formed in the pattern surrounded by the resist frame 60. At the same time of forming the second pole portion 220, the backward connecting part 223 may be formed. Thereafter, the plate-underfilm is removed and, as shown in FIG. 34, the surfaces of the second pole portion and the backward connecting part 223 are leveled through the forming the insulating film 36 and CMP, etc.

Since the antireflection film 4 is removed with the photoresist 6 in the developing process, the process to remove only the antireflection film 4 is not required. Thus, the degradation of the pattern precision of the resist frame and the decrease of the height of the resist frame, due to the difference in the etching rates between the second yoke portion and the second pole portion, are prevented. Consequently, the second pole portion 220 can be formed in a high precise pattern.

Figure 35:
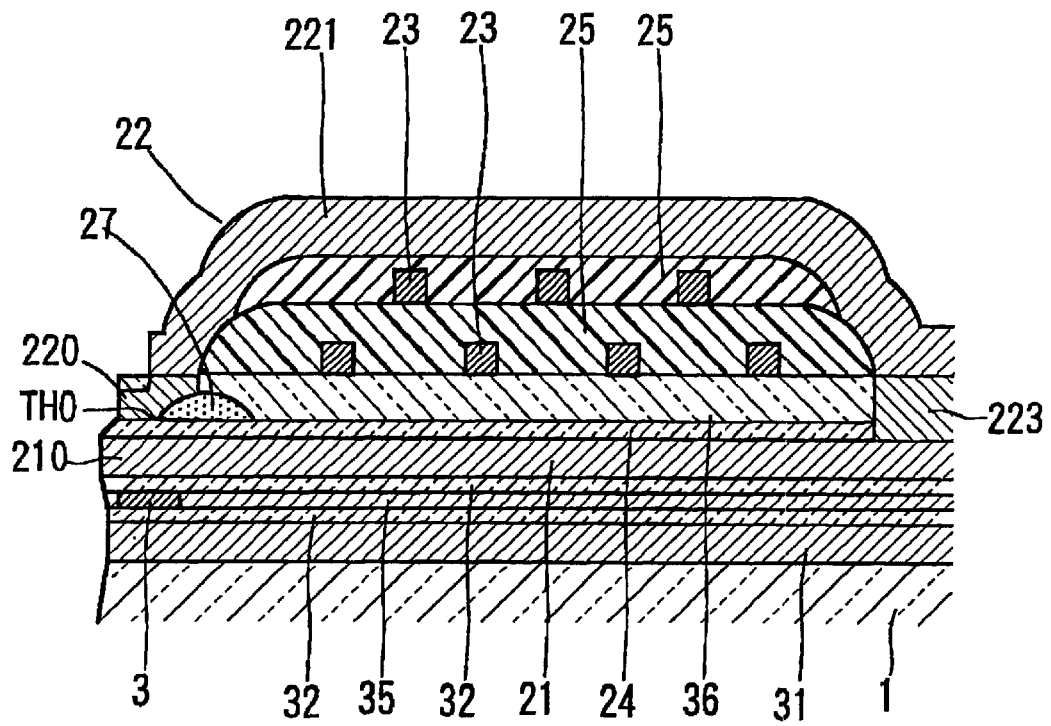
FIG. 35 is a cross sectional view showing a step after the step shown in FIG. 34.
Figure 36:
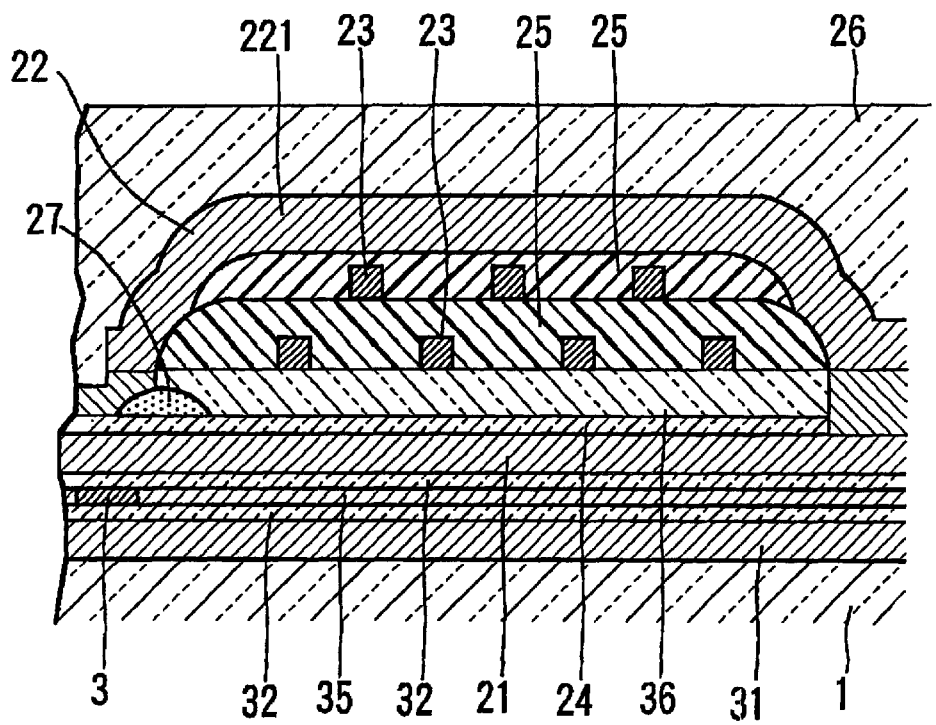
FIG. 36 is a cross sectional view showing a step after the step shown in FIG. 35.

Next, the coil film 23, the first insulating film 25 and the second yoke portion 221 are formed as shown in FIG. 35 and thereafter, the protective film 26 is formed.

This invention is not limited to the above embodiments and every kind of variation and modification may be made without departing from the scope of the present invention.

As above-mentioned, the following effects can be obtained, according to the present invention:

(a) A solution to be optically treated to form an antireflection film which resolves in a photoresist developer without the intermixing with the photoresist and a method for producing the antireflection film using the solution can be provided.

(b) A method for pattern-plating using the solution to be optically treated and a method for manufacturing a thin film magnetic head using the pattern-plating method can be provided.

(c) A method for manufacturing a thin film magnetic head in which a magnetic film is formed in a high precise pattern on an insulating film can be provided.

(d) A method suitable for manufacturing a thin film magnetic head having a narrowed recording track width can be provided.

What is claimed is:

1. A solution to be optically treated for an anti-reflective film, comprising a cyclopentanone solvent, polymethylglutarimide and a light absorption dye.

2. A solution to be optically treated as defined in claim 1, wherein the polymethylglutarimide has a following chemical constitutional formula:

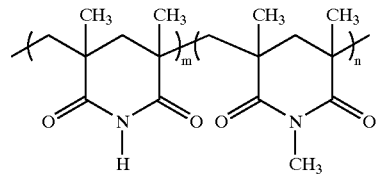

its molecular weight (Mw) being about 1000–30000, its compositional ratio (m:n) being about 50:50.

3. A solution to be optically treated as defined in claim 1, wherein the light absorption dye is an azobenzene-based dye.

4. The solution to be optically treated according to claim 3, wherein a concentration of polymethylglutarimide in the solution is about 3.0 wt %.

5. A solution to be optically treated as defined in claim 1, wherein the light absorption dye is a coumarin-based dye.

6. The solution to be optically treated according to claim 5, wherein the coumarin-based dye is either:

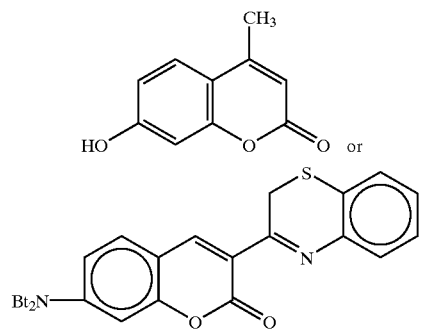

7. A solution to be optically treated as defined in claim 1, wherein the light absorption dye is a benzophenone-based dye.

8. The solution to be optically treated according to claim 1, wherein a concentration of polymethylglutarimide in the solution is about 3.0 wt %.

9. A method for forming an antireflection film on an object body comprising the steps of:

applying, on the object body, a solution to be optically treated including a cyclopentanone solvent, polymethylglutarimide and a light absorption dye, and thermally treating the solution to be optically treated applied on the object body.

10. A method for forming an antireflection film as defined in claim 9, wherein the thermal treatment is carried out at a temperature of 100–200° C.

11. A method for forming an antireflection film as defined in claim 9, wherein the polymethylglutarimide has a following chemical constitutional formula:

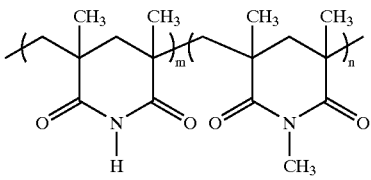

its molecular weight (Mw) being about 1000–30000, its compositional ratio (m:n) being about 50:50.

12. A method for forming an antireflection film as defined in claim 9, wherein
the light absorption dye is an azobenzene-based dye.

13. A method for forming an antireflection film as defined in claim 9, wherein the light absorption dye is a coumarin-based dye.

14. A method for forming an antireflection film as defined in claim 9, wherein
the light absorption dye is a benzophenone-based dye.

15. A method for pattern-plating comprising the steps of:
forming an antireflection film by applying, on a body to be plated having an inclined portion, a solution to be optically treated including a cyclopentanone solvent, polymethylglutarimide and a light absorption dye,
applying a photoresist so as to cover the antireflection film,
forming a resist frame composed of the photoresist and the antireflection film by carrying out a photolithography process to form a plate-pattern on a surface of the body to be plated for the photoresist and the antireflection film, and
plating the pattern surrounded by the resist frame.

16. A method for pattern-plating as defined in claim 15, wherein the antireflection film is formed through the thermal treatment at a temperature of 100–200° C. for the solution to be optically treated after the solution is applied onto the body to be plated.

17. A method for pattern-plating as defined in claim 15, wherein the polymethylglutarimide has a following chemical constitutional formula:

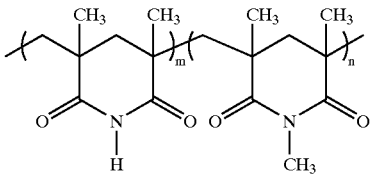

its molecular weight (Mw) being about 1000–30000, its compositional ratio (m:n) being about 50:50.

18. A method for pattern-plating as defined in claim 15, wherein the light absorption dye is an azobenzene-based dye.

19. A method for pattern-plating as defined in claim 15, wherein the light absorption dye is a coumarin-based dye.

20. A method for pattern-plating as defined in claim 15, wherein the light absorption dye is a benzophenone-based dye.

21. A method for manufacturing a thin film magnetic head including a slider having an air bearing surface in the opposing side of a recording medium and a thin film magnetic head element, supported by the slider, having a first magnetic film, a coil film, an insulating film, a gap film and a second magnetic film,
said first magnetic film including a first pole portion composed of the end portion of the first magnetic film in the side of the air bearing surface and a first yoke portion continuously connected to the first pole portion and extending to the backward of the first pole portion from the air bearing surface,
said gap film being positioned at least on a surface of the first pole portion,
said insulating film supporting the coil film, positioning above the first yoke portion and having a rising inclined portion in the side of the air bearing surface,
said second magnetic film including a second pole portion opposing to the first pole portion via the gap film and a second yoke portion, provided on the insulating film, continuously connected to the second pole portion and coupled to the first yoke portion at its backward, comprising the steps of:
forming a plate-underfilm for the second magnetic film on the insulating film including the inclined portion after forming the first magnetic film, the gap film, the coil film and the insulating film and before forming the second magnetic film,
forming an antireflection film on the insulating film and the plate-underfilm by applying, on the plate-underfilm on the surface of the insulating film including the inclined portion, a solution to be optically treated including a cyclopentanone solvent, polymethylglutarimide and a light absorption dye,
applying a photoresist so as to cover the antireflection film,
forming a resist frame composed of the photoresist and the antireflection film by a photolithography process to form the second magnetic film for the photoresist and the antireflection film, and
forming the second magnetic film in a pattern surrounded by the resist frame.

22. A method for manufacturing a thin film magnetic head as defined in claim 21, wherein the antireflection film is formed through the thermal treatment at a temperature of 100–200° C. for the solution to be optically treated after the solution is applied onto the body to be plated.

23. A method for manufacturing a thin film magnetic head as defined in claim 21, wherein the polymethylglutarimide has a following chemical constitutional formula:

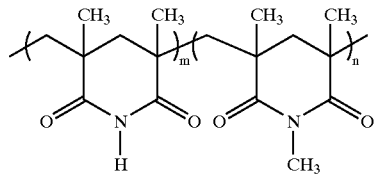

its molecular weight (Mw) being about 1000–30000, its compositional ratio (m:n) being about 50:50.

24. A method for manufacturing a thin film magnetic head as defined in claim 21, wherein the light absorption dye is an azobenzene-based dye.

25. A method for manufacturing a thin film magnetic head as defined in claim 21, wherein the light absorption dye is a coumarin-based dye.

26. A method for manufacturing a thin film magnetic head as defined in claim 21, wherein the light absorption dye is a benzophenone-based dye.

27. A method for manufacturing a thin film magnetic head as defined in claim 21, further comprising the step of forming a magnetic resistive effective element.

28. A method for manufacturing a thin film magnetic head including a slider having an air bearing surface in the opposing side of a recording medium and a thin film magnetic head element, supported by the slider, having a first magnetic film, a coil film, an insulating film, a gap film and a second magnetic film, said first magnetic film including a first pole portion composed of the end portion of the first magnetic film in the side of the air bearing surface and a first yoke portion continuously connected to the first pole portion and extending to the backward of the first pole portion from the air bearing surface, said gap film being positioned at least on a surface of the first pole portion, said insulating film including a first insulating film to support the coil film and a second insulating film to define a Throat Height zero point provided on the base portion of the first insulating film, said second magnetic film including a second pole portion opposing to the first pole portion via the gap film and a second yoke portion, provided on the first insulating film, continuously connected to the second pole portion and coupled to the first yoke portion at its backward, comprising the steps of:

forming the second insulating film on the gap film after forming the first magnetic film and the gap film and before forming the coil film, the first insulating film and the second magnetic film, forming a plate-underfilm on the gap film and the second insulating film, forming an antireflection film on the second insulating film and the plate-underfilm by applying, so as to cover the plate-underfilm on the second insulating film, a solution to be optically treated including a cyclopentanone solvent, polymethylglutarimide and a light absorption dye, applying a photoresist so as to cover the antireflection film, forming a resist frame composed of the photoresist and the antireflection film by a photolithography process to form the second magnetic film for the photoresist and the antireflection film, and forming the second magnetic film in a pattern surrounded by the resist frame.

* * * * *